(12) United States Patent
Takeuchi et al.

(10) Patent No.: US 6,594,012 B2
(45) Date of Patent: Jul. 15, 2003

(54) EXPOSURE APPARATUS

(75) Inventors: Seiji Takeuchi, Utsunomiya (JP);
Minoru Yoshii, Tokyo (JP); Hiroshi Maehara, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/886,887

(22) Filed: Jul. 2, 1997

(65) Prior Publication Data
US 2002/0093656 A1 Jul. 18, 2002

(30) Foreign Application Priority Data

Jul. 5, 1996 (JP) .............................. 8-176432
Oct. 4, 1996 (JP) .............................. 8-264383

(51) Int. Cl.⁷ .............................................. G01B 11/00
(52) U.S. Cl. ................. 356/394; 356/372.4; 356/372.5; 356/603; 356/614
(58) Field of Search ................................. 356/394, 372, 356/373, 374, 356, 358, 363, 401, 237.1–237.5, 600–603, 614; 250/237 G, 548, 559.29; 430/22, 5, 312, 322

(56) References Cited

U.S. PATENT DOCUMENTS

| | | | |
|---|---|---|---|
| 5,461,474 A | 10/1995 | Yoshii et al. | 356/237 |
| 5,486,919 A | 1/1996 | Tsuji et al. | 356/349 |
| 5,521,036 A | * 5/1996 | Iwamoto et al. | 356/400 |
| 5,585,918 A | 12/1996 | Takeuchi et al. | 356/237 |
| 5,610,715 A | * 3/1997 | Yoshii et al. | 356/356 |
| 5,610,718 A | 3/1997 | Sentoku et al. | 356/363 |
| 5,652,657 A | 7/1997 | Yoshii et al. | 356/394 |
| 5,777,744 A | * 7/1998 | Yoshii et al. | 356/372 |
| 5,834,767 A | * 11/1998 | Hasegawa et al. | 250/237 |

* cited by examiner

Primary Examiner—Frank G. Font
Assistant Examiner—Sang H. Nguyen
(74) Attorney, Agent, or Firm—Fitzpatrick, Cella, Harper & Scinto

(57) ABSTRACT

A pattern inspection system for detecting a state of a pattern formed on an object, includes a light projecting device for projecting input light on to a sensitized pattern defined on the object, a light receiving device for receiving signal light from the sensitized pattern, a processing device for detecting a change in the light by use of a signal from the light receiving device to detect the state of formation of the sensitized pattern, and a control device for changing a condition of incidence of light from the light projecting device.

49 Claims, 27 Drawing Sheets

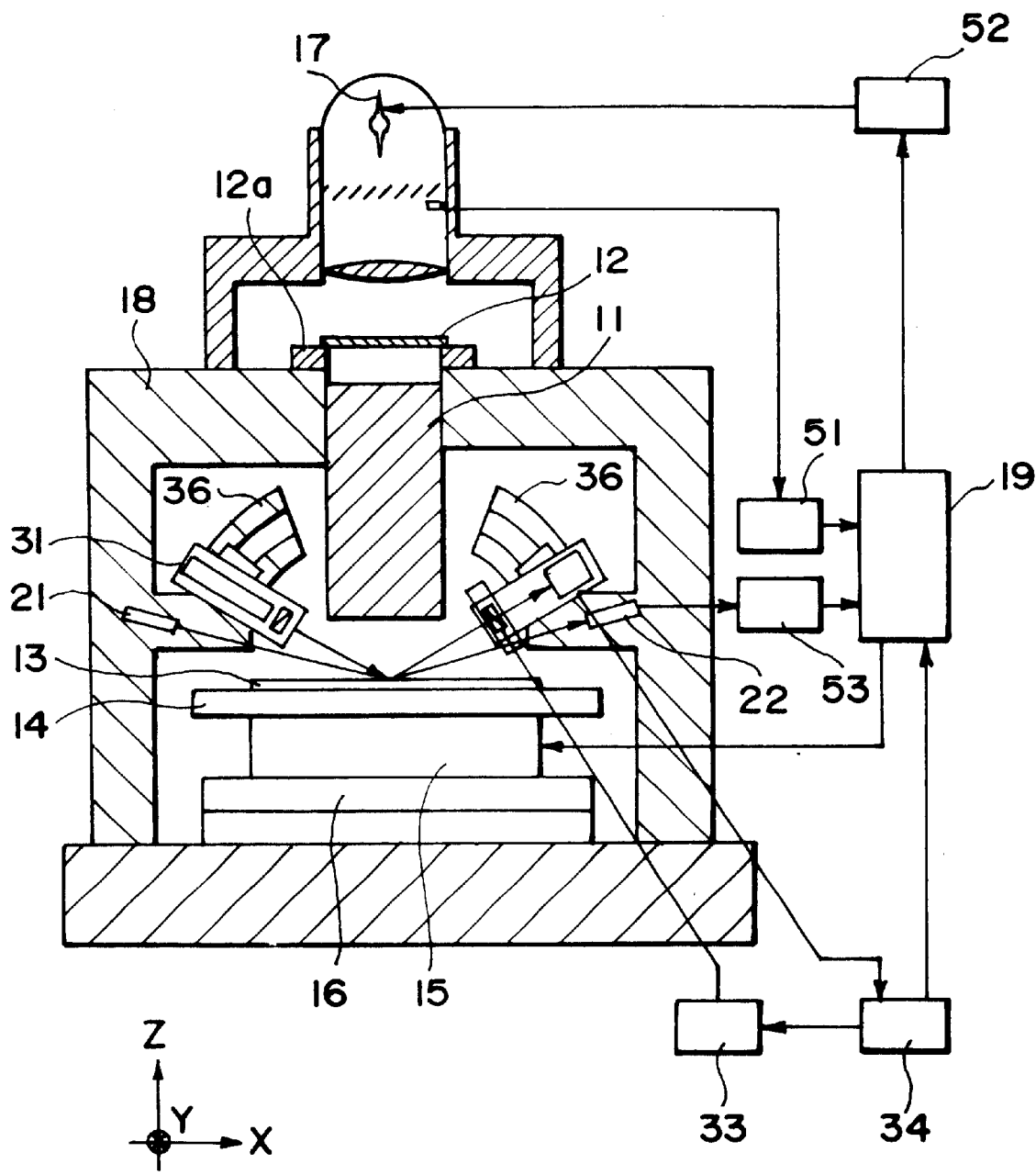
F I G. 1

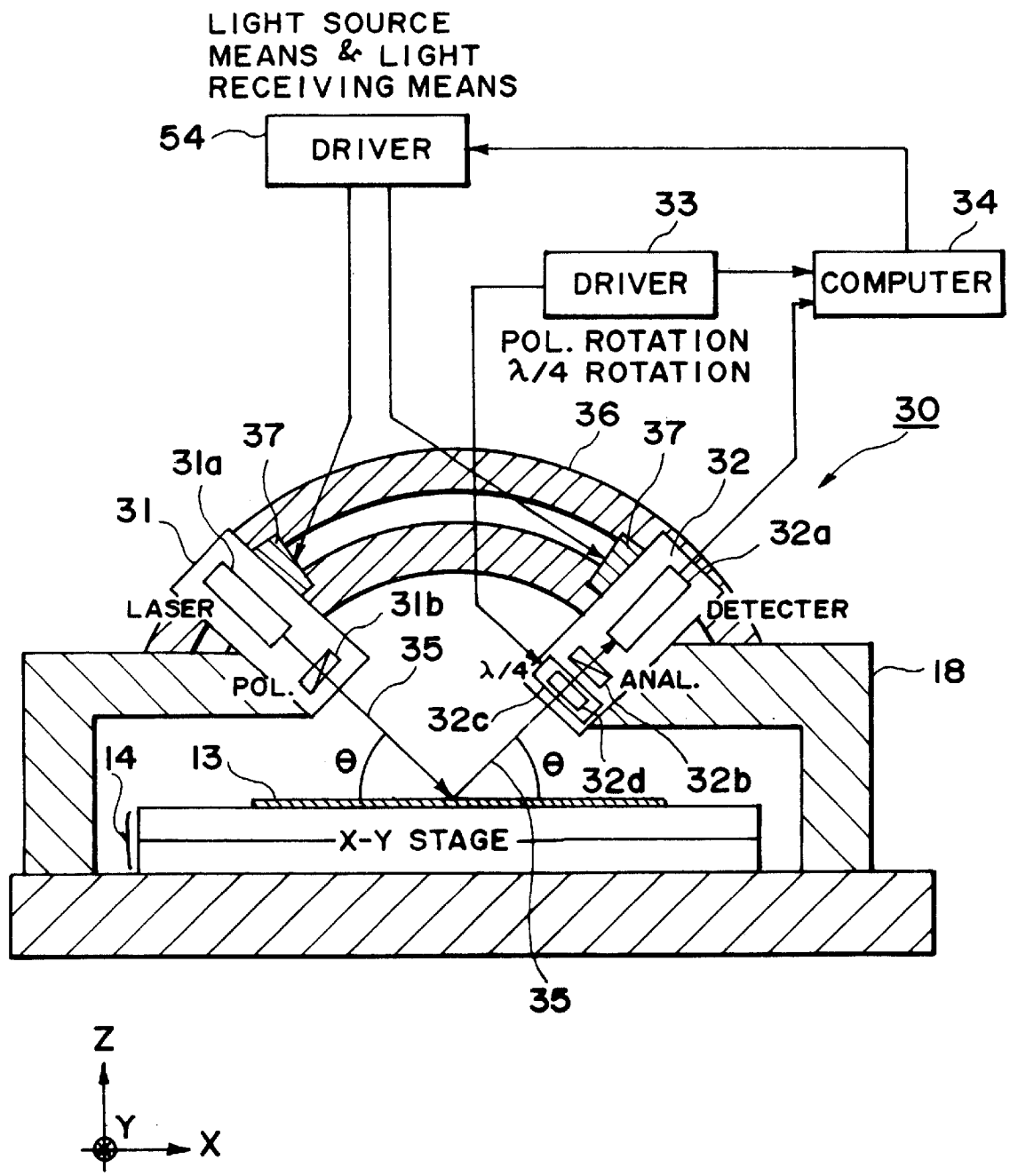
F I G. 2

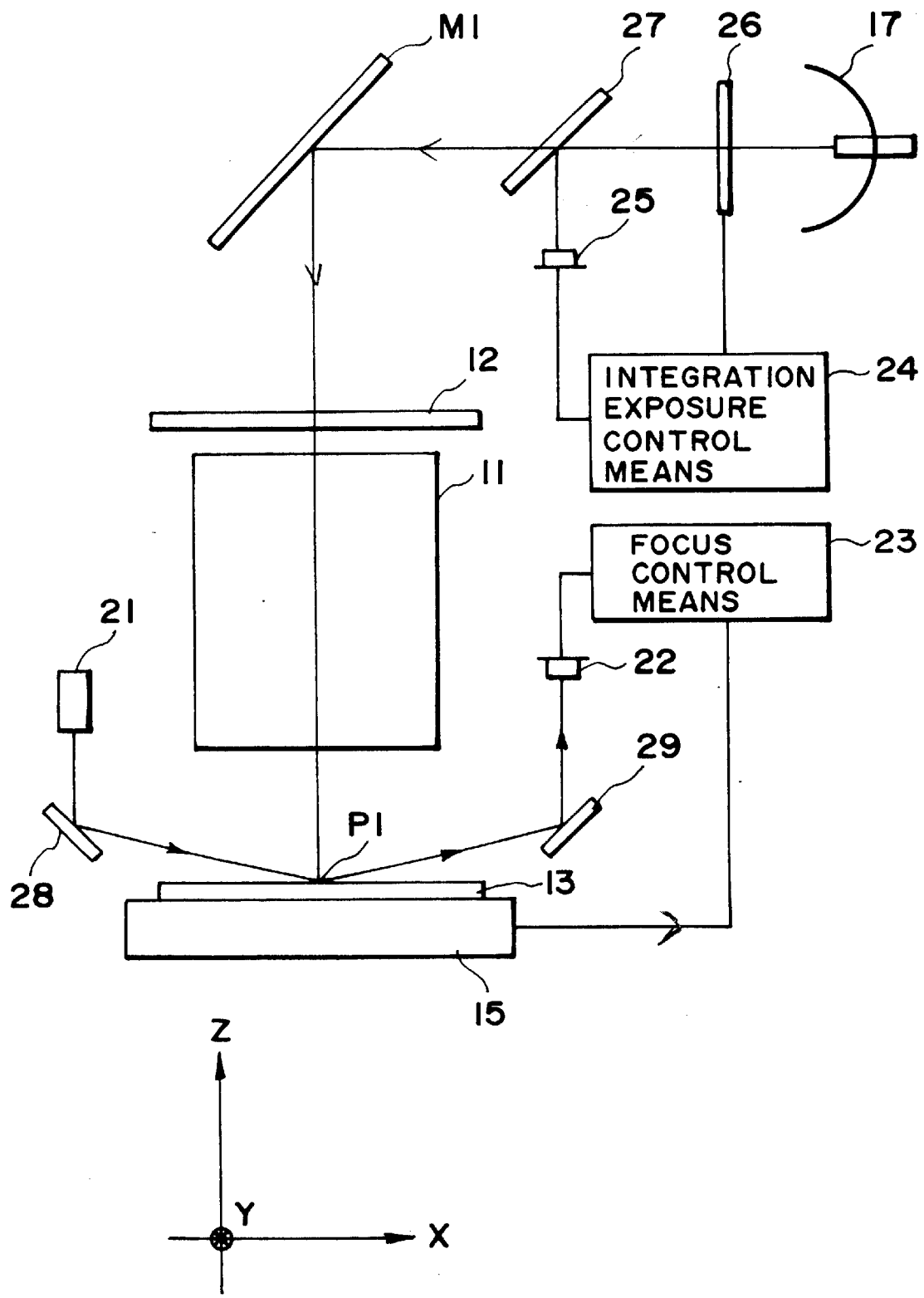
F I G. 3

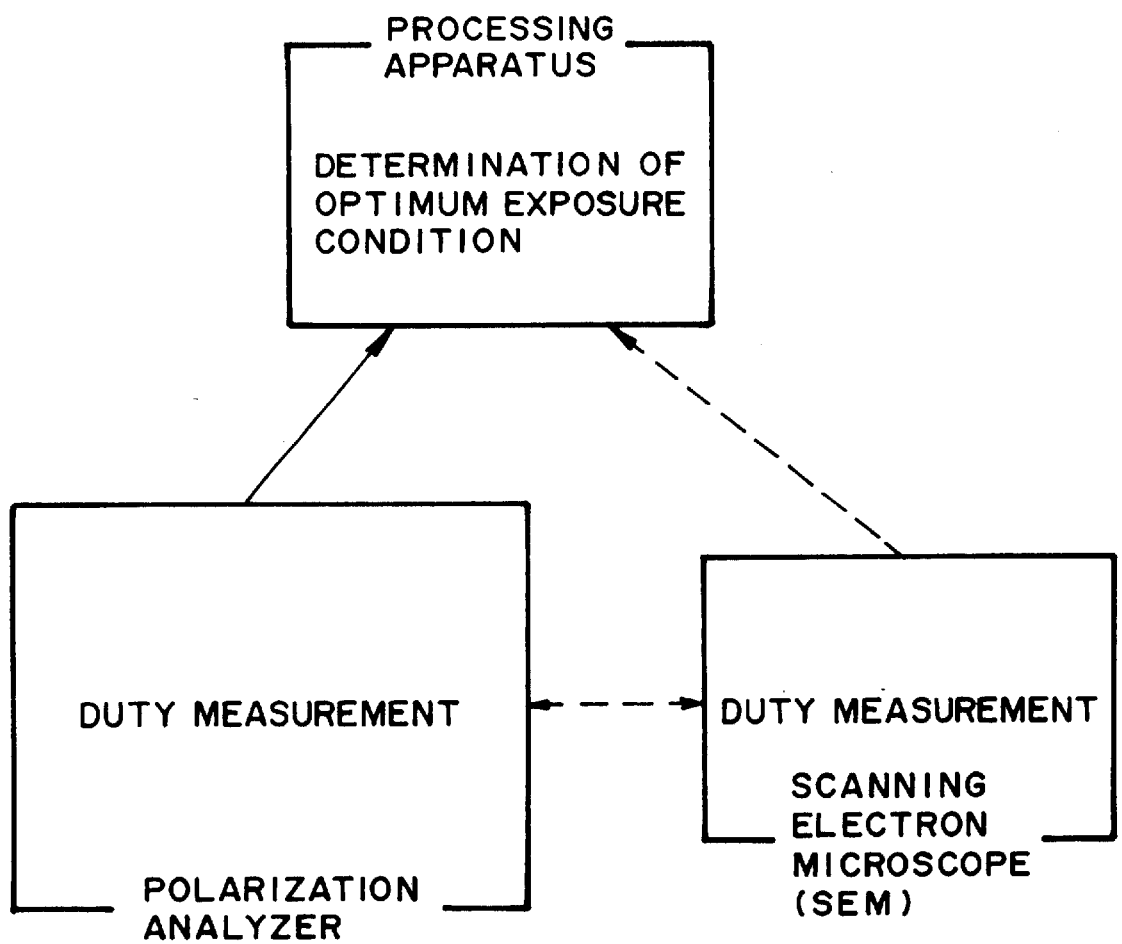
F I G. 7

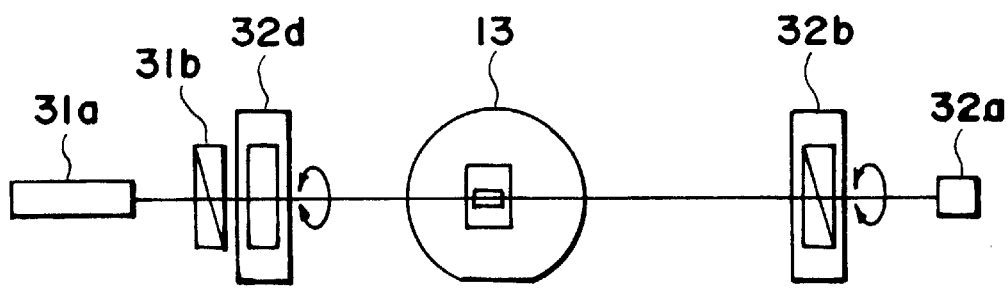
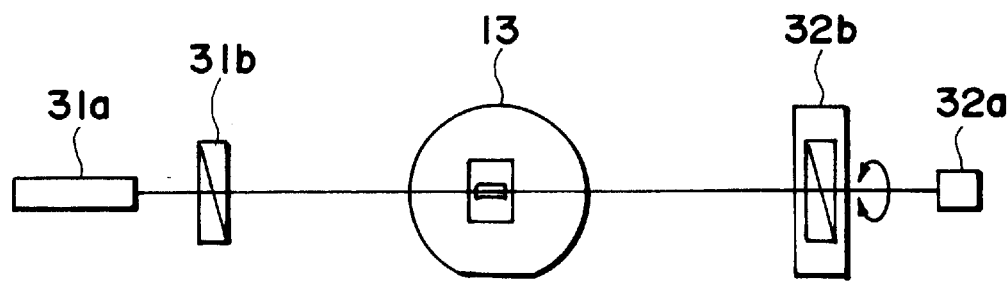
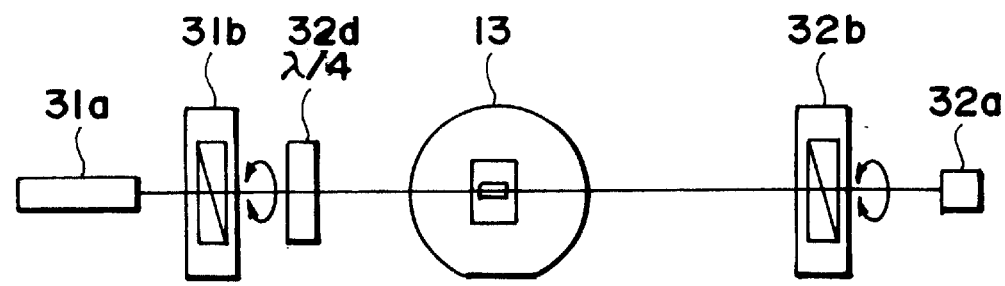
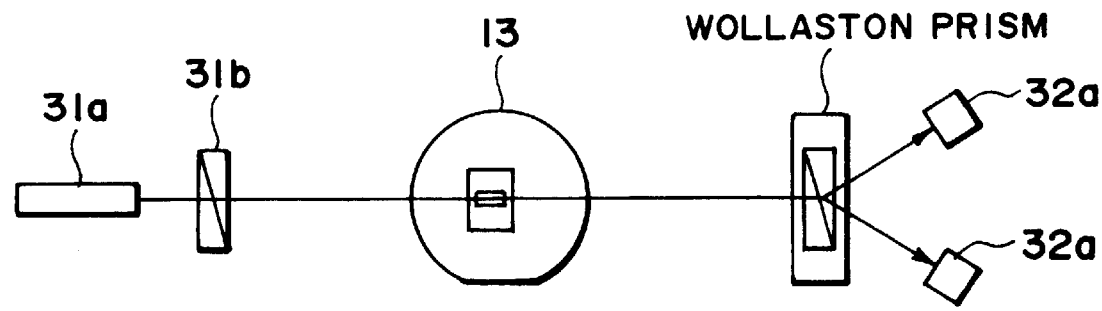
F I G. 10

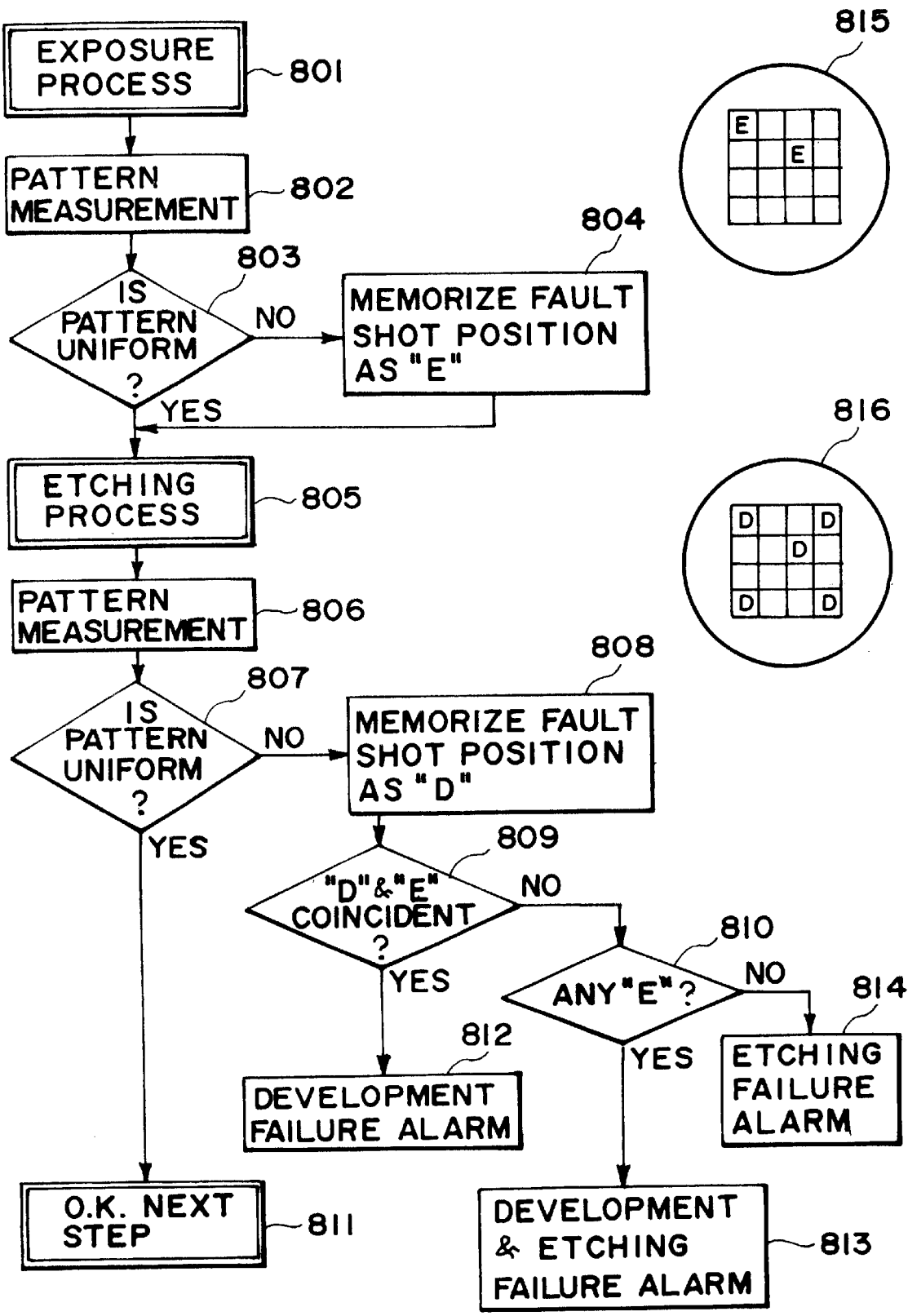
F I G. 25

EXPOSURE APPARATUS

FIELD OF THE INVENTION AND RELATED ART

This invention relates to an exposure apparatus and, more particularly, to a pattern inspecting system or a substrate processing procedure monitoring system using such an inspection system. In another aspect, the invention is concerned with an exposure apparatus having an inspection system or a substrate processing procedure monitoring system such as above. The present invention is particularly suitable for determination of optimum exposure condition promptly or in real time to perform an exposure step in lithographic process, among manufacturing processes for production of devices such as semiconductor devices (e.g., IC or LSI), image pickup devices such as CCD, display devices such as liquid crystal panels, or magnetic heads, for example, on the basis of monitoring procedure in a processing system used in the lithographic process. The invention is applicable specifically for detection of any failure in a processing step promptly, to ensure process control.

Recently, the degree of integration of semiconductor device such as IC or LSI has been increased considerably, and fine processing technology of semiconductor wafer has also been much advanced. In this fine processing technology, many proposals have been made to a reduction projection exposure apparatus (stepper) wherein an image of a circuit pattern of a mask (reticle) is formed on a photosensitive substrate by a projection optical system (projection lens) and wherein the photosensitive substrate is exposed in step-and-repeat method.

In such steppers, a circuit pattern of a reticle is projected, in a reduced scale, at a predetermined position on the surface of a wafer through a projection optical system having a predetermined reduction magnification. After completion of one projection transfer operation, a stage on which the wafer is placed is moved by a predetermined amount. Then, the transfer operation is repeated. This procedure is repeated to perform exposure of the whole wafer surface.

Generally, in order to assure transfer of fine circuit pattern by use of a stepper having a projection optical system, it is important to set exposure condition such as wafer exposure amount or wafer focus position (wafer position with respect to a direction of an optical axis of the projection optical system) appropriately.

To this end, in conventional steppers, trial printing process (send-ahead) is performed prior to initiation of mass-production procedure. In such trial printing process, the exposure condition, that is, at least one of focus position and exposure amount (shutter time) is changed successively with respect to different shots. After printing of a photosensitive substrate, it is treated by a developing process, and the line width of a straight pattern developed is measured by use of an optical microscope or a line-width measuring device. Optimum exposure condition is then determined.

As regards lateral direction of wafer shot layout, for example, the exposure process may be performed with constant focus value while changing exposure amount (shutter time) successively by regular amount. As regards longitudinal direction of the wafer shot layout, the exposure process may be performed with constant exposure amount while changing focus value successively by regular amount.

Then, the line width of a resist pattern (L&S pattern) of lines and spaces in each shot, as defined through the developing process, may be measured by use of a scanning electron microscope (SEM). On the basis of this, optimum focal point position and optimum exposure amount may be determined.

In this procedure, however, measurement of the line width of a resist pattern on a wafer through a scanning electron microscope, for example, for setting optimum exposure condition (exposure amount or focus position) in steppers requires a long processing time.

Further, an exposure wafer has to be processed by a developing step, an etching step and an ashing step, for example. Through these steps, a final pattern is formed on the wafer. Thus, depending on a condition in such processing step after exposure, there is a possibility that the state of formation of such final pattern on the wafer varies.

In mass-production of devices, the state of formation of such pattern should desirably be constant. However, due to various factors, the condition in a processing step may change which in turn may cause a decrease in yield. It is therefore necessary to monitor the processing step periodically and to control the same.

Usually, such process control is based on measurement of a line width of a straight pattern by use of an optical microscope or a line-width measuring device. Thus, it takes a long time for the process control.

SUMMARY OF THE INVENTION

It is an object of the present invention to provide a pattern inspection system by which optimum exposure condition can be determined in a short time period.

It is another object of the present invention to provide a projection exposure apparatus having such a pattern inspection system.

In a pattern inspection system of the present invention, the state of sensitization of a resist sensitized by exposure (i.e. latent image) or the state of formation of a sensitized pattern such as a line-and-space pattern after being developed, is measured on the basis of a change in light projected under different light incidence conditions, for example, a change in intensity of reflection light or a change in state of polarization. An optimum exposure condition is determined on the basis of a measured value. Mass-production exposure of wafers is performed under that optimum exposure condition.

It is a further object of the present invention to provide a substrate processing step monitoring system by which quick and assured process control is enabled and production of large-integration pattern is enabled. In a substrate processing step monitoring system of the present invention, for control of a developing step, for example, the state of sensitization of an exposed resist (i.e. latent image) before developing process and the state of formation of a sensitized pattern such as a line-and-space pattern after the developing process, are measured on the basis of a change in projected light, for example, a change in intensity of reflection light or a change in state of polarization. Then, on the basis of comparison of measured values, a change in state of pattern formation is detected and whether the fault has been created during the developing process or before the developing process is discriminated.

In accordance with a further aspect of the present invention, there is provided a pattern inspection system for detecting a state of a pattern formed on an object, said system comprising: light projecting means for projecting input light on to a sensitized pattern defined on the object; light receiving means for receiving signal light from the sensitized pattern; processing means for detecting a change in the light by use of a signal from said light receiving means to detect the state of formation of the sensitized pattern; and control means for changing a light incidence condition of light from said light projecting means.

In accordance with a still further aspect of the present invention, there is provided a projection exposure apparatus for projecting a pattern of a first object, as illuminated with exposure light, on to a second object coated with a photosensitive material through a projection optical system to thereby form a sensitized pattern on the second object, said apparatus comprising: light projecting means for projecting input light on to the sensitized pattern with different conditions of light incidence; light receiving means for receiving signal light from the sensitized pattern; and processing means for detecting a change in the input light by use of a signal from said light receiving means to detect the state of formation of the sensitized pattern.

In accordance with a yet further aspect of the present invention, there is provided a projection exposure method for projecting for projecting a pattern of a first object on to a second object coated with a photosensitive material through a projection optical system, said method comprising the steps of: illuminating the pattern of the first object with exposure light while changing an exposure condition and projecting the pattern of the first object so illuminated on to the second object, whereby a plurality of sensitized patterns are formed on the second object; projecting input light from light projecting means to the sensitized patterns under different conditions of light incidence; receiving, through light receiving means, signal light from the sensitized patterns; detecting a change in input light by use of a signal from the light receiving means to detect a state of formation of the sensitized patterns through processing means; and controlling exposure condition of the second object through control means, on the basis of a signal from the processing means.

In accordance with a further aspect of the present invention, there is provided a substrate processing procedure monitoring system, comprising: light projecting means for projecting input light on to a pattern defined on a substrate; light receiving means for receiving signal light from the pattern; detecting means for detecting a change in input light by use of a signal from said light receiving means; and processing means having inspecting means for detecting a state of formation of the pattern on the basis of detection by said detecting means, for memorizing and comparing results of detection of the state of formation of the pattern before and after the processing procedure to the substrate.

In accordance with a still further aspect of the present invention, there is provided a substrate processing procedure monitoring method, comprising the steps of: projecting input light on to a periodic pattern defined on a substrate; receiving, through light receiving means, signal light from the pattern; detecting a change in input light by use of a signal from the light receiving means; detecting a state of formation of the pattern on the basis of detection at said detecting step; and memorizing and comparing results of detection of the state of formation of the pattern before and after the processing procedure to the substrate.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a sectional view of a main portion of an arrangement according to an embodiment of the present invention.

FIG. 2 is a sectional view of a polarization analysis system of the arrangement of FIG. 1.

FIG. 3 is a schematic view for explaining focus detection and exposure amount control in an exposure apparatus.

FIG. 7 is a schematic view for explaining calibration of a measured value of a polarization analysis system, through a scanning electron microscope (SEM).

FIG. 10 is a schematic view for explaining polarization analysis method.

FIG. 25 is a flow chart of a procedure to be done in another embodiment of the present invention.

DESCRIPTION OF THE PREFERRED EMBODIMENTS

Figure 4:
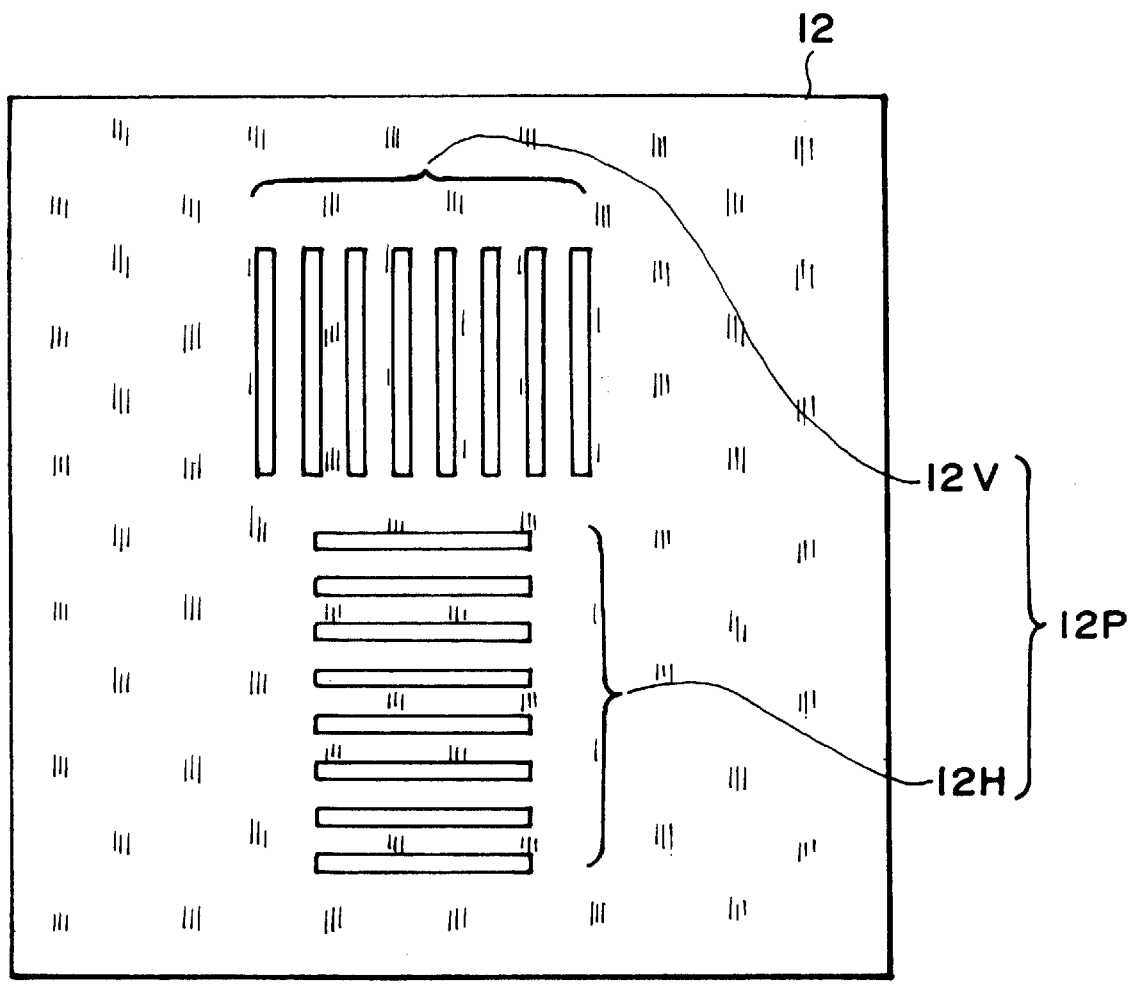
FIG. 4 is an enlarged top plan view of a reticle pattern for measurement of exposure condition.

First, optimum exposure condition setting for projection exposure for printing a pattern of a first object (reticle) on a second object (wafer) by projection, according to the present invention, will be explained.

The present invention is based on a principle that, when a pattern is transferred to a resist, an average value or effective value of refractivity of a resist pattern varies with a change in (a) focus position and (b) exposure amount.

More specifically, in the present invention, as a reticle (R), a mask with an exposure condition measurement pattern which comprises a line-and-space pattern having a periodicity in one direction, for example, is used, and images of such reference pattern are printed sequentially onto a wafer (W) while changing at least one of the exposure amount and the focus.

Latent image in the resist material on the wafer defined through this sequential exposure (i.e., an image defined by a portion whose refractivity has been changed due to chemical change caused by exposure) or a protrusion-recess pattern (rectangular-wave-like pattern) on the wafer formed after a development process is then irradiated with input light from a light projecting means under different light incidence conditions. Signal lights from the sensitized patterns are received by light receiving means. By using signals from the light receiving means, changes in input light (changes in state of polarization of input light or changes in intensity of it) are detected. On the basis of detection of changes in plural lights corresponding to the different light incidence conditions, respectively, the state of formation of the sensitized pattern is detected through processing means. Then, on the basis of a signal from the processing means, control means controls the exposure condition to the wafer (i.e., exposure amount or position with respect to an optical axis direction, for example).

Now, an example of such a change of light will be explained, with reference to a case where the state of polarization of input light changes.

For a sensitized pattern, light having a predetermined wavelength and a predetermined state of polarization is projected on to a resist with a predetermined angle of incidence. The light is transmitted through the resist. The light is reflected by the surface of the wafer bottom substrate, and it is transmitted again through the resist. The light going out of the resist is combined with the light having been directly reflected by the surface of the resist. The state of polarization of such combined light is measured.

It is known that, for a protrusion-recess pattern phase type diffraction grating, no diffraction light is produced with a wavelength longer than the pitch thereof, and it has a double refraction characteristic.

In an embodiment of the present invention, description will be made mainly on a case where reflection light is detected. However, if the pitch of a resist pattern is larger than the wavelength, diffraction light is produced. Similar measurement is attainable with such diffraction light.

Now, a polarization analysis method used in the present invention will be explained.

It is now assumed that grating thickness is d and duty ratio (the ratio of a remaining resist portion to the period) is t, and also that laser light having a wavelength greater than the period is perpendicularly incident on a double refraction element. Here, it is known that, depending on whether the state of polarization of the input or projected light is parallel to or perpendicular to the grating groove, refractivities $n\|$ and $n\bot$ in the periodic structure portion of the double refraction element are given by the following equations. When effective refractivity with respect to light parallel to the grating groove is $n\|$, and effective refractivity with respect to light perpendicular to the grating groove is $n\bot$, then:

$$n\| = \sqrt{(t \cdot n1^{}2 + (1-t) \cdot n2^{}2)}$$

$$n\bot = 1/\sqrt{((t/n2^{}2) + (1-t)/n2^{}2))}$$

where n1 and n2 are refractivities of the line portion and of the space portion of the grating. The line portion L and the space portion S are such that, for a case of resist latent image, L corresponds to a resist and S corresponds to an exposed resist. When the resist is developed, L corresponds to a resist and S corresponds to a gas such as an air.

The equations of refractivity mentioned above are approximation equations in a case where the period of the periodic structure is sufficiently small as compared with the wavelength. If the electric field is calculated exactly, the refractivity can be calculated also in a case where the period is the same as or similar to the wavelength or a case where a structure other than a periodic structure is used.

A model of polarization analysis corresponds to measurement double refractivity of a double refractivity medium of a predetermined thickness, on a wafer substrate. The polarization analysis method is such that rectilinearly polarized light having a zero P/S phase difference (between P-polarization and S-polarization) and having an amplitude ratio of 1 is projected upon a wafer substrate, such as above, with a predetermined angle θ, and phase difference (Δ) and amplitude ratio (ø) of reflected light therefrom are measured, to thereby determine $n\|$ and $n\bot$. Then, from the refractivities n1 and n2 of the line portion L and of the space portion S and resist thickness d, having been measured beforehand, and from the values of $n\|$ and $n\bot$ determined in accordance with the polarization analysis method described above, duty t is determined by use of the equation mentioned above or the equation solved exactly. Since such polarization analysis method is known in the art, description of details of it will be omitted.

As regards the light incidence condition (e.g., incidence angle, azimuth angle with respect to pattern direction, wavelength), optimum condition varies with the refractivity of resist, film thickness thereof or the shape of the pattern. The condition also varies for a developed resist pattern measurement and for a latent image resist pattern measurement. Further, for a latent image, since the difference in refractivity between an exposed portion and an unexposed portion is small, in order that a minute change to be produced in pattern shape with a small change in exposure condition is resolved and detected with a small change in light, measurement may be made with such incidence condition that a large change is produced in light with exposure condition.

An embodiment of the present invention is thus arranged to provide a system whereby light can be projected under different incidence conditions, such that, on the basis of polarization analysis method as above, the duty of a latent image pattern of a resist or of a protrusion-recess pattern image after developed is measured.

In an embodiment of the present invention, from a value measured under a certain light incidence condition, an optimum light incidence condition is calculated, and, with the measurement of such optimum light incidence condition, measurement of enhanced resolution is enabled.

In accordance with polarization analysis method, there are cases wherein, depending on light incidence condition, the same polarization state is reproduced with different resist film thicknesses or different resist pattern shapes. In consideration of this, in an embodiment of the present invention, a change in reflection light under different light incidence conditions is detected such that different resist shapes, which may otherwise appear as being overlapped, may be resolved under a different light incidence condition, whereby a measured value is produced.

An embodiment of the present invention comprises a step for transferring a line-and-space pattern on to a photosensitive substrate with different exposure conditions to thereby form plural sensitized patterns thereon, a step for projecting light to the sensitized patterns sequentially and detecting states of polarization of lights from the patterns to thereby calculate duties of the sensitized patterns on the basis of the polarization states, a step for determining an exposure condition with which a desired duty is attainable, and a step for printing wafers under the determined exposure condition, wherein the light projecting means is arranged to provide different light incidence conditions for the light to be projected.

First Embodiment

A first embodiment of the present invention will now be explained with reference to drawings. FIG. 1 is a schematic view of a main portion of a first embodiment of the present invention, and FIGS. 2–5 are schematic views, respectively, corresponding to portions of FIG. 1, respectively.

In this embodiment, a change in state of polarization is to be detected as a change in input light through a sensitized pattern.

In FIG. 1, denoted at 11 is a reduction projection lens for projecting a circuit pattern 12a on the surface of a reticle 12, illuminated with exposure light from an exposure light source 17 (to be described later) onto the surface of a wafer 13. Denoted at 14 is a wafer chuck to which the wafer 13 is attracted. Denoted at 15 is a rough-motion and fine-motion stage for providing rough-motion and fine-motion of the wafer chuck 14 in the Z direction. Denoted at 16 is an X-Y stage for moving the wafer chuck 14 in X and Y directions. Denoted at 17 is an exposure light source, and denoted at 18 is a structure for supporting the light source 17, reticle 12, barrel 1, wafer stage 16, and arch 36. Also provided are a sensor for sensing exposure light from the exposure light source 17. The sensor feeds a signal to processor 51. Likewise, detecting device 22 detects a light amount from the surface of the wafer 13 and feeds a signal to processor 53. Processors 51 and 53 send signals to computer 19, which in turn sends a signal to controller 52, which controls the exposure light source 17.

Referring to FIG. 4, description will be made on control means of the present invention which includes a focus position control system for detecting the focus position, i.e., the position of the wafer 13 with respect to an optical axis direction of the projection lens 11, and an exposure amount control system to be used in relation to illumination of the reticle 12 with exposure light.

In FIG. 3, denoted at 21 is a high-luminance light source such as a semiconductor laser, for example. Laser light from the light source 21 is deflected by a deflection mirror 28 and, after this, it is projected upon the surface of the wafer 13. After being reflected at a measurement point P1 on the wafer 13, the light is deflected by a deflection mirror 29 and is projected upon a detecting device 22 which serves to detect a two-dimensional position of light incident thereon. The detecting device 22 comprises a CCD, for example, and it functions to detect the position of incidence of light thereupon. Here, a change in position of the wafer 13 surface with respect to Z direction (optical axis direction of the projection lens 11) can be detected as a positional displacement of the incidence position of light upon the detecting device 22. On the basis of a signal from this detecting device 22, the focus control system 23 controls the Z-axis position of the wafer 13, i.e., the focus position, with use of the rough-motion and fine-motion stage 105.

Denoted at 26 is a shutter opening/closing mechanism, and denoted at 27 is a half mirror. Denoted at 25 is an illuminance sensor for detecting the amount of exposure with light from the light source 17, as reflected by the half mirror 27. Integration exposure amount control device 24 serves to control the shutter opening/closing mechanism 26 on the basis of a signal from the illuminance sensor 25, to thereby control integrated exposure amount with the light from the light source 17. With this procedure, the exposure amount, irradiating the reticle 12, is controlled to a predetermined amount.

In this embodiment, control means having an exposure amount control system and a focus position control system such as described above is used to control the exposure condition for projection of a pattern of the reticle 12 on to the wafer 13 surface.

Next, description will be made on a case wherein a pattern of the reticle 12 illuminated with exposure light from the light source 17 is projected on to the wafer 13 surface.

FIG. 4 illustrates a reference pattern 12P formed on the surface of a reticle 12. The reference pattern 12P comprises orthogonally arrayed line-and-space patterns 12V and 12H.

In this embodiment, the reticle 12 having a pattern 12P, comprising line-and-space patterns 12V and 12H, is set on the reticle stage 12a. A wafer 12 having a resist applied thereto is set on the wafer chuck 14. The pattern 12P of the reticle 12 is then sequentially printed on the wafer 13 in accordance with step-and-repeat method. Here, the focus control system 23 and the integration exposure amount control system 24 described above are used so that, as shown in FIG. 6, zones (shots) 13P are printed sequentially whereby latent images 13V and 13H of the patterns 12V and 12H are printed.

Figure 5:
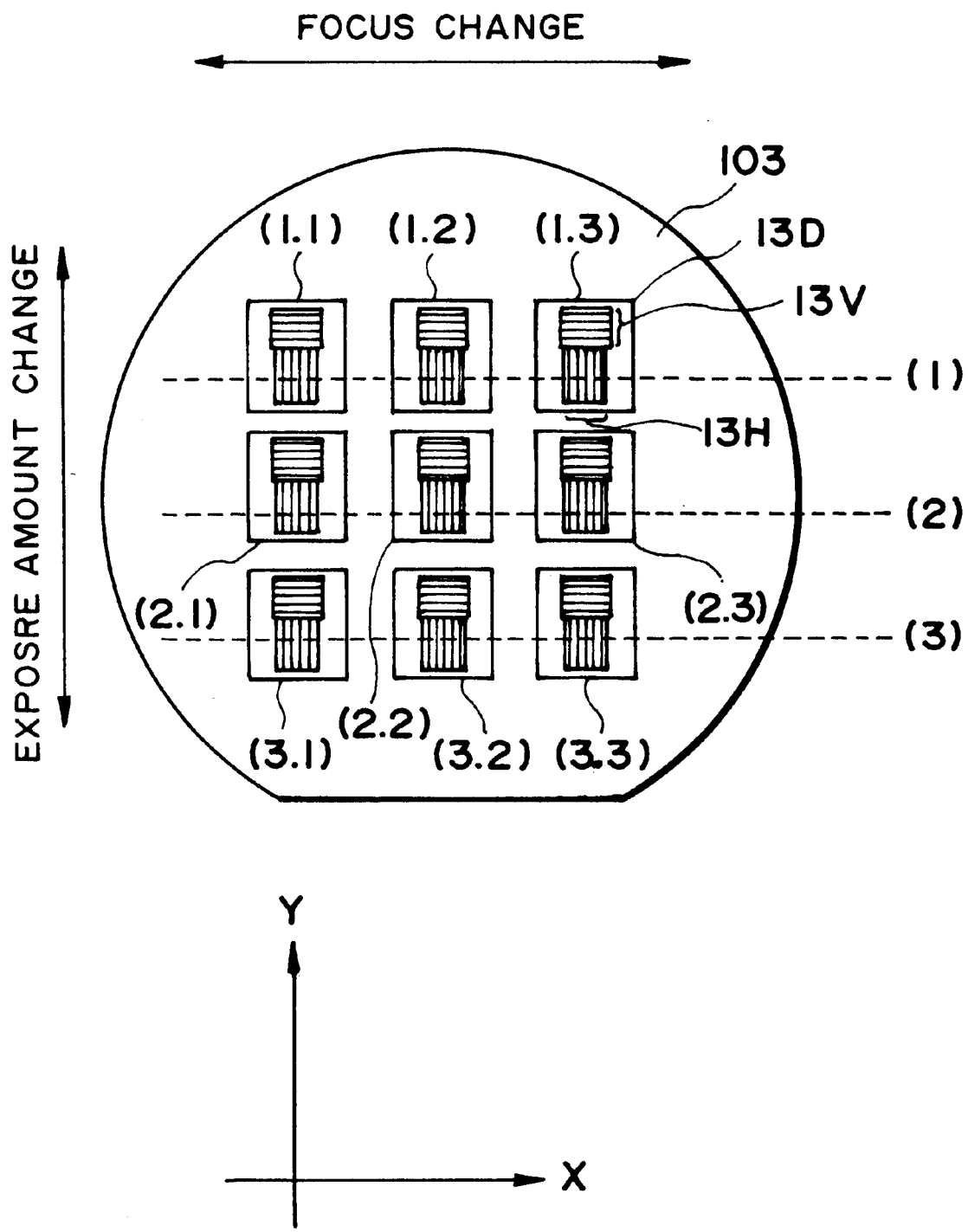
FIG. 5 is a schematic view for explaining a resist latent image on a wafer, being printed with varying exposure condition.

Here, stepwise motion is performed while changing the focus offset by regular amounts, about an expected optimum position (expected best focus position), in accordance with the shot position with respect to the X direction. As regards the shots in the Y direction, similarly, exposures are performed while changing the exposure amount, about an optimum exposure amount (shutter time). In the example of FIG. 5, a matrix of 3×3 on wafer 103 is illustrated for convenience of explanation. The more the number of shots is, the easier the determination of the condition is.

Figure 6A:
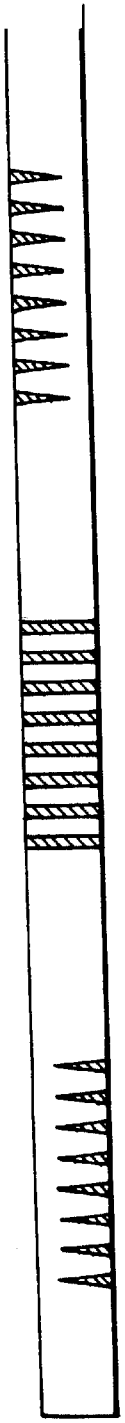
FIGS. 6A–6C are schematic and sectional views, respectively, each for explaining a resist latent image on a wafer of FIG. 5.
Figure 6B:
Figure 6C:

FIGS. 6A–6C are schematic views of a section of a resist of a wafer 13, having been exposed sequentially as described above. As shown in these drawings, in the resist of the wafer 13 after exposure, a latent image is formed. A latent image is an image having been defined by a change in property of the resist resulting from chemical change, for example, caused by exposure light. Hatched portions in the drawings represent portions having been exposed to light. Generally, the refractivity has been changed in these portions. The matrix addresses in FIGS. 6A–6C corresponds to sections at those positions corresponding to the addresses in FIG. 5. FIGS. 6A, 6B and 6C are sections taken on lines (1), (2) and (3) in FIG. 5, respectively.

A resist of wafer 13 after exposure with latent images such as shown in FIGS. 6A–6C is subjected to measurement of an amplitude ratio ø and a phase difference Δ of reflection light to light irradiated, by means of a polarization analysis system 30 which comprises a light source 31, a light receiving portion 32, a driver 33 and a polarization processing device 34, without being demounted from the wafer chuck 14.

FIG. 2 is a schematic view of a main portion of such polarization analysis system 30 of FIG. 1. FIG. 10 is a schematic view, illustrating the same with optical paths being extended. In FIGS. 2 and 10, light source means (light projecting means) 31 comprises a light source 31a (which provides a wavelength longer than the line-and-space pitch on the wafer 13 and which may comprise a He—Ne laser or a semiconductor laser or, alternatively, monochromatic light from a spectrometer) and a polarization element 31b such as a Glan-Thompson prism, for example. The polarization element 31b has its polarization plane disposed at 45 deg. with respect to the sheet of the drawing, so that, with respect to the wafer 13, the same quantity of P-polarization component (parallel to the sheet of the drawing) and S-polarization component (perpendicular to the sheet of the drawing) are provided. Thus, the phase difference $\Delta$ between these P-polarized light and S-polarized light is zero, and an amplitude ratio $\emptyset$ is 1.

The light receiving portion (light receiving means) 32 comprises a quarter wave plate 32d having its anisotropic axis perpendicular to the light 35, a polarization element (analyzer) 32b such as a Glan-Thompson prism, for example, and a photoelectric converting element 32a. The quarter wave plate 32d is held within a rotary mechanism 32c having a rotational axis along the light 35 direction. It is rotatable at a constant speed in response to a signal from a driver 33.

Light 35 from the light source means 31 is reflected by the surface of a resist on the wafer 13 and by the surface of the wafer substrate. In combined light of these reflection lights, the phase difference $\Delta$ and amplitude ratio $\emptyset$ of P-polarized component and S-polarized component vary in accordance with the double refractivity n1 and n2, for example, of the resist on the wafer 13.

This light is detected by the detector 32a, by way of the rotating quarter wave plate 32d and analyzer 32b, whereby an electric signal of sine wave corresponding to the phase difference $\Delta$ and amplitude ratio $\emptyset$ is produced. Then, from positional information of sine wave of DC component magnitude and amplitude thereof, the phase difference $\Delta$ and amplitude $\emptyset$ are determined.

Then, from n∥ and n⊥ as calculated from $\Delta$ and $\emptyset$ having been measured with polarization analysis method as well as from refractivity n1 of the unexposed portion of the resist, refractivity n2 of an exposed portion thereof, thickness d of the resist, and complex refractivity of the substrate, having been measured beforehand, the duty t⊥ (duty as n⊥ is used) is determined in accordance with the following equation:

$$t\perp = n1^{}2 \cdot (n2^{}2 - n\perp^{}2) / \{n\perp^{}2 \cdot (n2^{}2 - n1^{}2)\}$$

Also, the duty t∥ (duty as n∥ is used) is given by:

$$t\| = (n\|^{}2 - n2^{}2)/(n1^{}2 - n2^{}2)$$

By averaging these two values, the precision of duty t can be improved.

$$t = (t\perp + t\|)/2$$

In FIG. 2, the light source means 32 and the light receiving portion 31 are fixed to the arch 36. As the driver 54 actuates the driving means 37 to move along the arch 36 in an arcuate path, the incidence angle can be changed. For example, when the subject of measurement is a latent image before a development process, since an optimum incidence angle with which the duty can be measured precisely varies with a resist used, an optimum angle can be selected in accordance with a difference in refractivity between an exposed portion and exposed portion, or the film thickness of the resist, for example. Further, since the optimum incidence angle varies largely between a case where the subject of measurement is a latent image before a development process and a case where it is a developed pattern after a development process, an incidence angle appropriate to the subject of measurement is set in response to a signal from a computer 34. More specifically, the light incidence condition (incidence angle) may be determined on the basis of changes in light under different incidence conditions.

On the other hand, FIG. 7 illustrates how an optimum exposure condition is determined on the basis of comparison of a duty of a sample line-and-space, measured through polarization analysis, and a value having been provided by developing the same sample and by measuring it through a scanning electron microscope. An offset of a duty to be caused by an underlying bottom structure, when polarization analysis method is used, may be measured. In the following measurement, such an offset may be subtracted from a measured value, and a resultant value may be taken as a correct measured value. The comparison with use of a scanning electron microscope may be made only once when the condition such as a process is changed, and it is not necessary thereafter.

Figure 8:
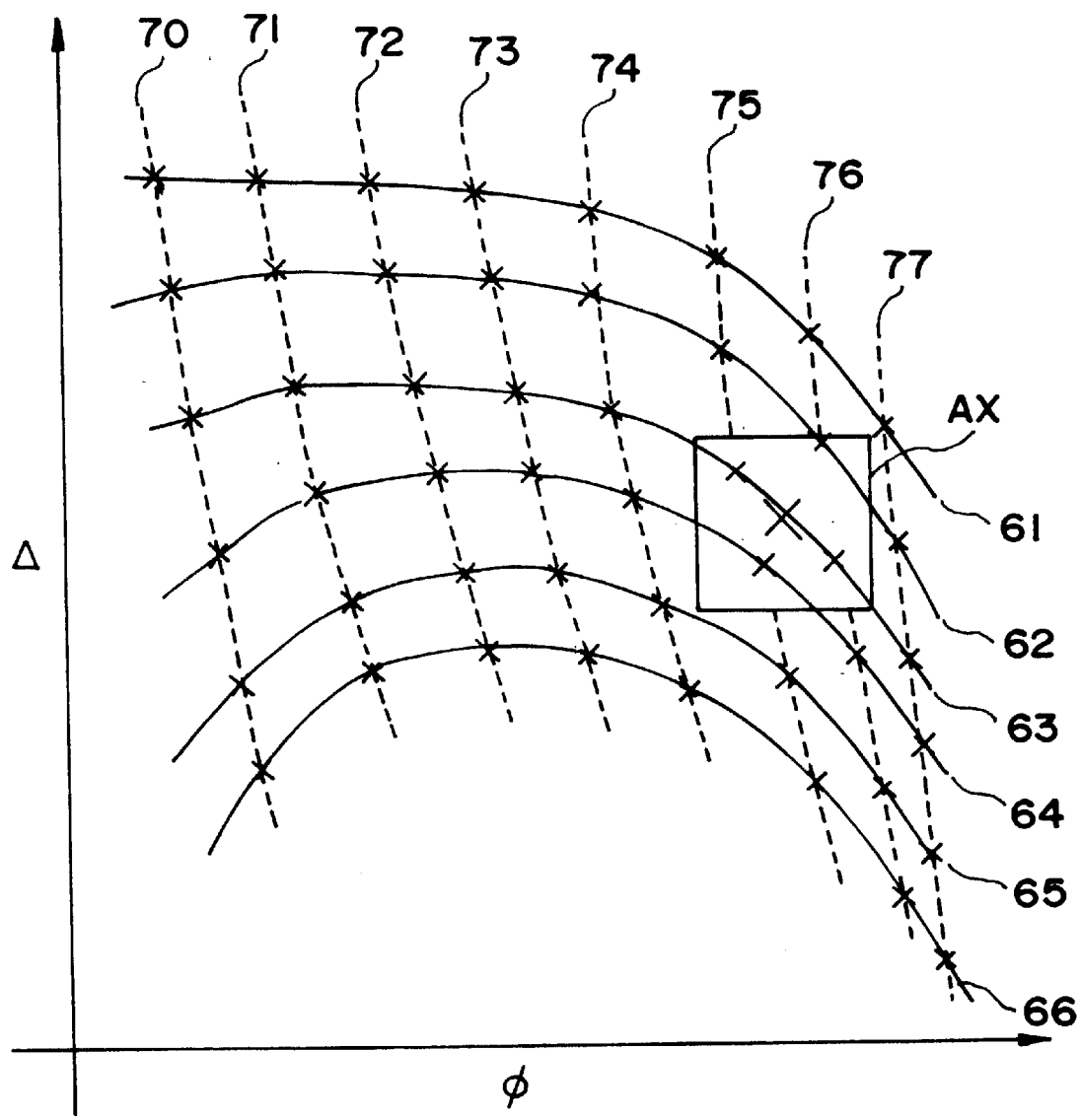
FIG. 8 is a graph of Δ-ø map.

Next, the procedure of exposure condition optimization will be explained with reference to FIGS. 8 and 9. FIG. 8 shows an example wherein chips of 8×6 are printed on one wafer and wherein results of polarization analysis to the same are illustrated in $\Delta$-$\emptyset$ map. For example, as regards measurement points on a line 70, the exposure amount is kept constant while the focus varies. On the other hand, as regards measurement points on a line 61, the focus is constant while the exposure amount varies.

The shots illustrated within a rectangular frame AX on this $\Delta$-$\emptyset$ map represents a range wherein an optimum duty is established, on the basis of scanning electron microscope measurement as described above. Thus, when an exposed shot is measured through polarization analysis method and if $\Delta$ and $\emptyset$ are within this frame AX, an optimum duty is indicated.

Figure 9:
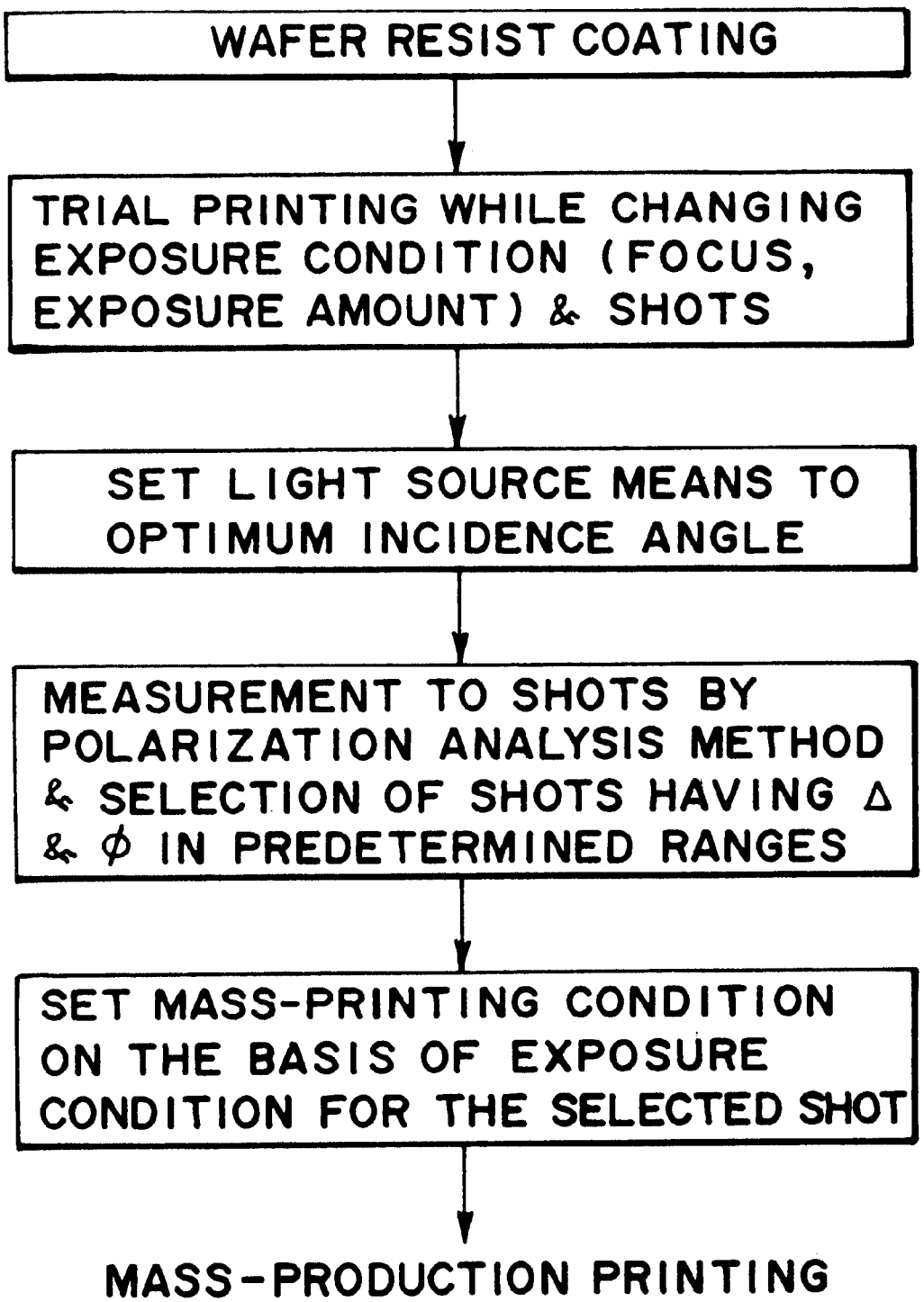
FIG. 9 is a flow chart of a procedure in a case where polarization analysis method is applied for exposure condition setting.

The procedure described above can be illustrated in a flow chart, such as shown in FIG. 9. First, a resist is applied to a wafer. If the thickness of the resist is not known, it is measured at this stage. Subsequently, the stage is moved stepwise as described hereinbefore and trial printing is made while changing the focus and exposure amount (shutter time). In accordance with complex refractivity ns of the substrate, refractivities n1 and n2 of an unexposed portion and exposed portion of the resist, thickness d of resist and wavelength $\lambda$ used, the incidence angle $\theta$ is set and fixed to such an optimum angle with which high measurement sensitivity is assured.

Subsequently, without unloading the wafer from the wafer chuck, the stage is moved similarly and, while changing shots successively, $\Delta$ and $\emptyset$ are measured in accordance with polarization analysis method. If the results of polarization analysis is within the predetermined range for $\Delta$ and $\emptyset$ shown in FIG. 8, the exposure condition with which that shot has been printed is taken as an optimum exposure condition for mass-production printing.

The duty check based on polarization analysis method may be made at desired timings in the course of wafer mass-production printing procedure, whereby increased yield is assured. In this embodiment of the present invention, as described, an optimum exposure condition is set in the manner described above and, after that, a wafer is processed by a predetermined development procedure, whereby large-integration devices are produced.

Figure 13:
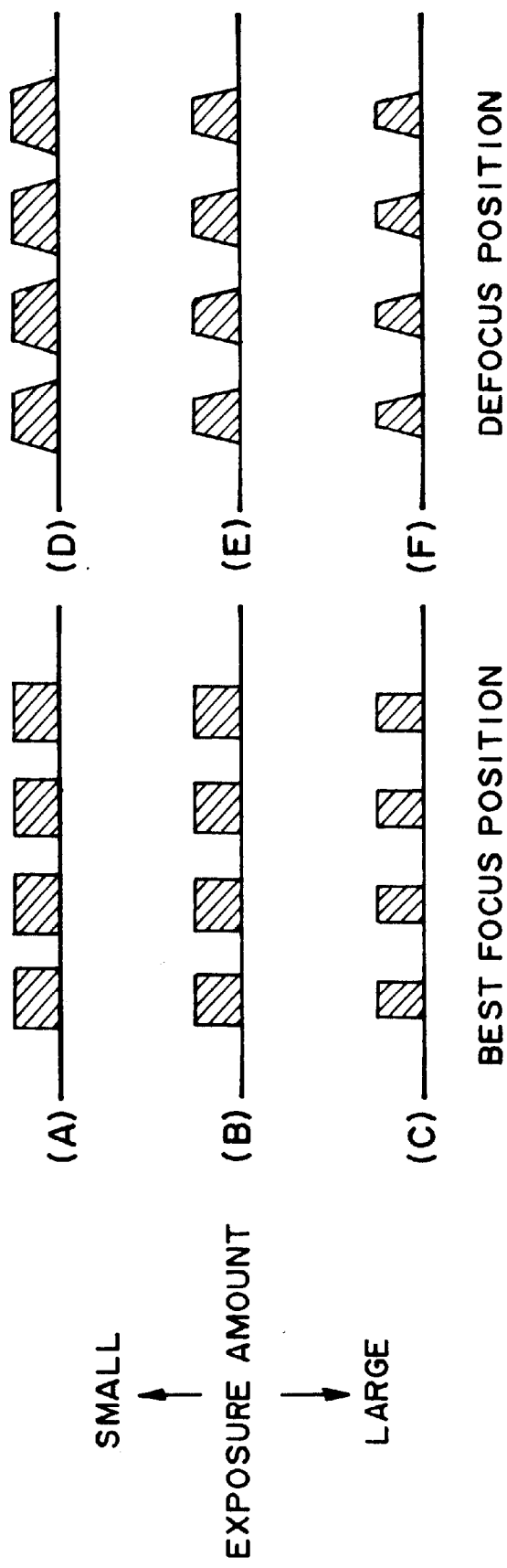
FIG. 13 is a schematic view for explaining examples of sectional shape of a resist after a development process.

While in the foregoing the invention has been described mainly with reference to a case wherein a latent image before development is taken as the subject of measurement, since in this embodiment the incidence angle is variable, it can be applied to polarization analysis of a developed pattern after development of a resist. FIG. 13 illustrates sectional shapes of sensitized patterns, after resist development process, related to this embodiment. It is seen from FIG. 13 that, since there is a large difference in refractivity between lines and spaces as compared with measurement to a latent image pattern (because the medium of refractivity n2 is a gas having a refractivity of about 1.0), this example is advantageous in the point of duty measurement precision. Thus, if the condition is restricted, measurement to a developed pattern may desirably be chosen.

Figure 14:
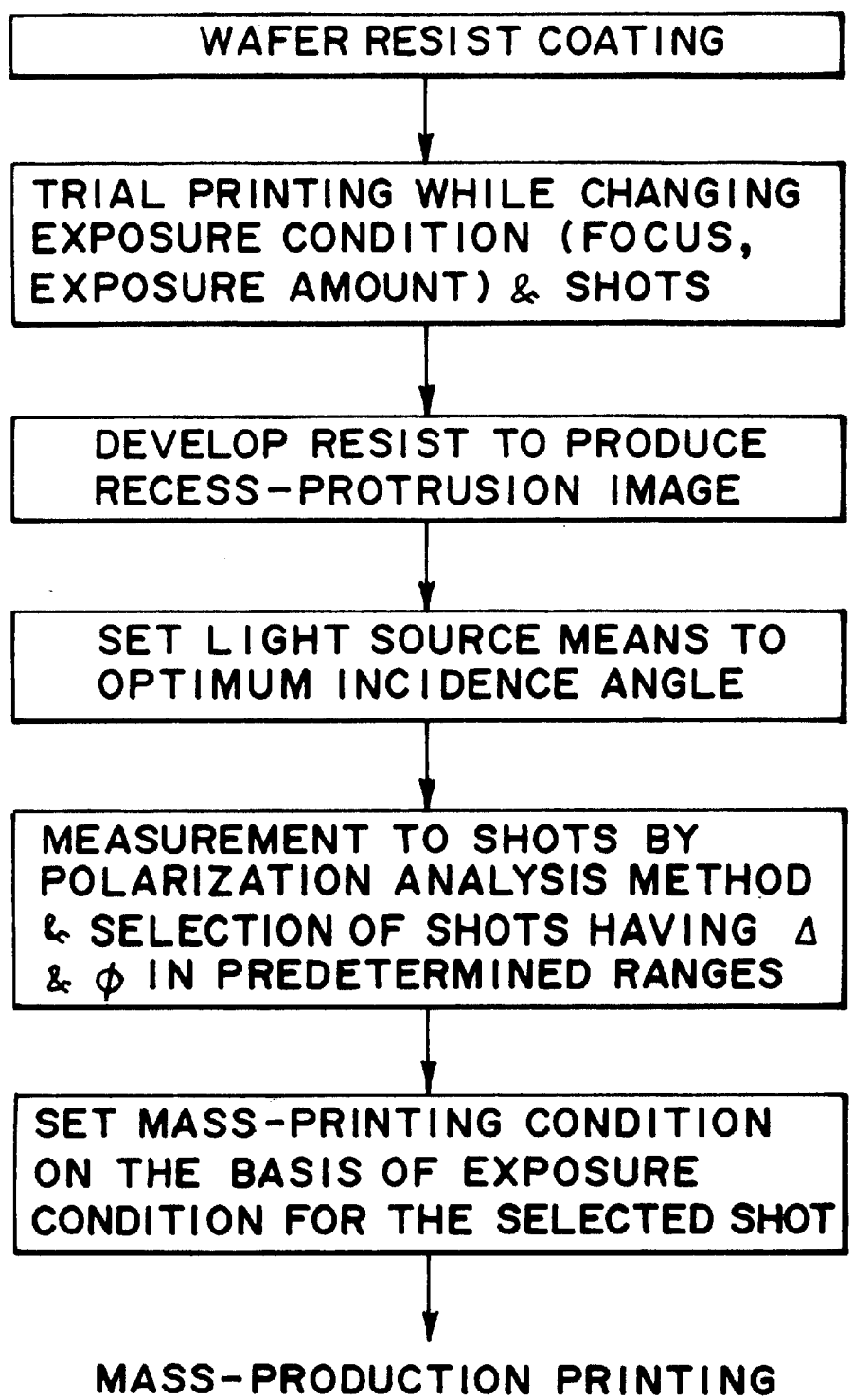
FIG. 14 is a flow chart of a procedure wherein a development process is added.

FIG. 14 is a flow chart in a case where a developed pattern is to be measured in accordance with this embodiment. In this case, a developer (developing apparatus) for resist development and a scanning electron microscope are used in combination, and measurement is made to a developed image, not a latent image. The scanning electron microscope may be used for calibration of pattern shape measurement based on polarization analysis, at the moment when checking of a developed resist image is required. Before start of measurement according to the flow chart of FIG. 14, the incidence angle θ is fixed in accordance with complex refractivity ns of substrate, refractivity n1 and thickness d of resist, wavelength λ, for example, to an optimum angle with which high measurement precision is assured. After this is accomplished, the measurement procedure is performed.

Second Embodiment

A second embodiment of the present invention corresponds to an embodiment wherein, in the structure of FIG. 2, the direction of light incidence is made variable. The term "direction of incidence" corresponds to an incidence azimuth angle which is defined, with respect to a certain direction upon a sensitized pattern surface, by a plane of incidence as defined by an axis of a projected light and a normal to the sensitized pattern. In FIG. 2, there is a rotational stage (not shown) disposed below the X-Y stage underneath the wafer chuck 14. After the X-Y stage moves a sensitized pattern, just to be measured, to the position of light projection spot, the rotational stage rotationally moves the sensitized pattern relative to the light source means and the light receiving portion, toward an optimum direction of incidence appropriated to the substrate under a resist, the refractivities n1 and n2 of unexposed and exposed portions of the resist, the thickness d of resist, and the period, angle and number of lines of an exposed pattern. In this manner, polarization analysis measurement is performed with the direction of incidence with which high sensivity measurement is assured. More specifically, light incidence condition (incidence azimuth angle) is determined on the basis of changes in light under different incidence conditions (incidence azimuth angles). The remaining portion of this embodiment is essentially the same as the first embodiment.

It is to be noted that a similar advantageous result is attainable when, in place of a rotational stage below the wafer X-Y stage, a driving system which is rotatable around an axis coincident with a normal to a wafer and passing through the point of incidence upon the arch 36 of FIG. 2.

Third Embodiment

A third embodiment of the present invention corresponds to an embodiment wherein, in the structure of FIG. 2, the wavelength of projected light is made variable. For example, the light source of the light source means 31 may comprise a combination of a halogen lamp and a spectroscope. When a latent image resist pattern is the subject of measurement, if measurement is made with use of a short wavelength close to a resist sensitizing wavelength, an unexposed portion is sensitized and it causes a change in pattern. In consideration of this, in this embodiment the measurement is made with use of a sufficiently long wavelength with respect to which a resist used does not have a sensitivity. When on the other hand a developed resist pattern is the subject of measurement, since it is a pattern having been subjected to a development process, a high-sensitivity shorter wavelength is used to assure high-precision measurement.

Further, since optimum wavelength of projected light varies in accordance with the substrate under a resist, the refractivities n1 and n2 of unexposed and exposed portions of the resist, the thickness d of it, the period, angle and number of lines of an exposed pattern, for example, measurement may preferably be made with an optimum light wavelength suited to the subject of measurement. More specifically, the incidence condition (wavelength of projected light) is determined on the basis of changes in light under different incidence conditions (wavelengths of projected light).

The remaining portion of this embodiment is essentially the same as the first embodiment.

Similar advantageous result of variable wavelength of projected light is attainable with an arrangement wherein light from a halogen lamp is passed through a spectroscope and, by using an optical fiber, the light from an exit port of the spectroscope is directed to the light source means. Without use of a combination of a halogen lamp and a spectroscope, a tunable laser or plural semiconductor lasers may be used with similar advantageous result.

Fourth Embodiment

Figure 11:
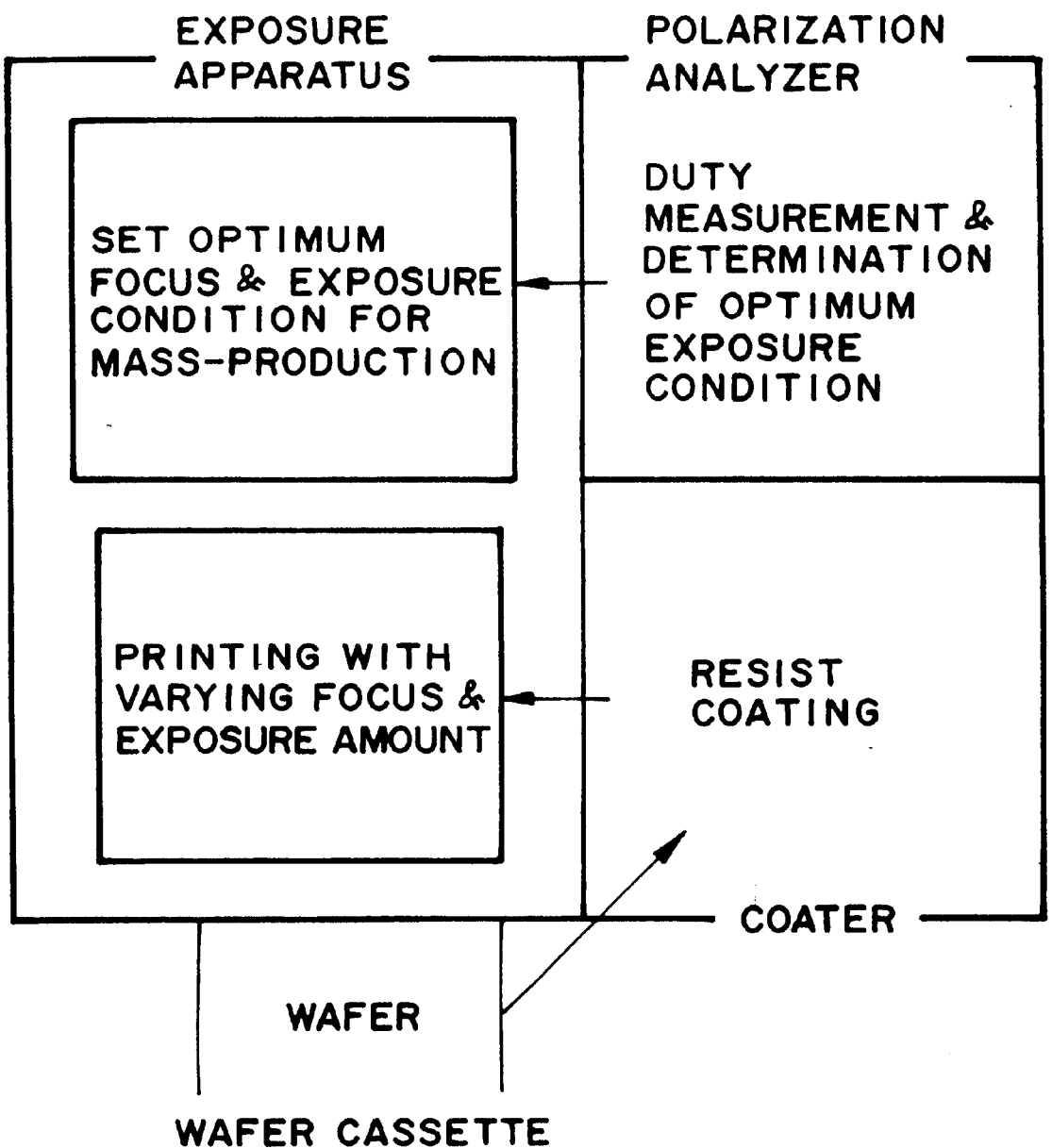
FIG. 11 is a schematic view of an arrangement according to another embodiment of the present invention, wherein a polarization analysis system is disposed separately.
Figure 12:
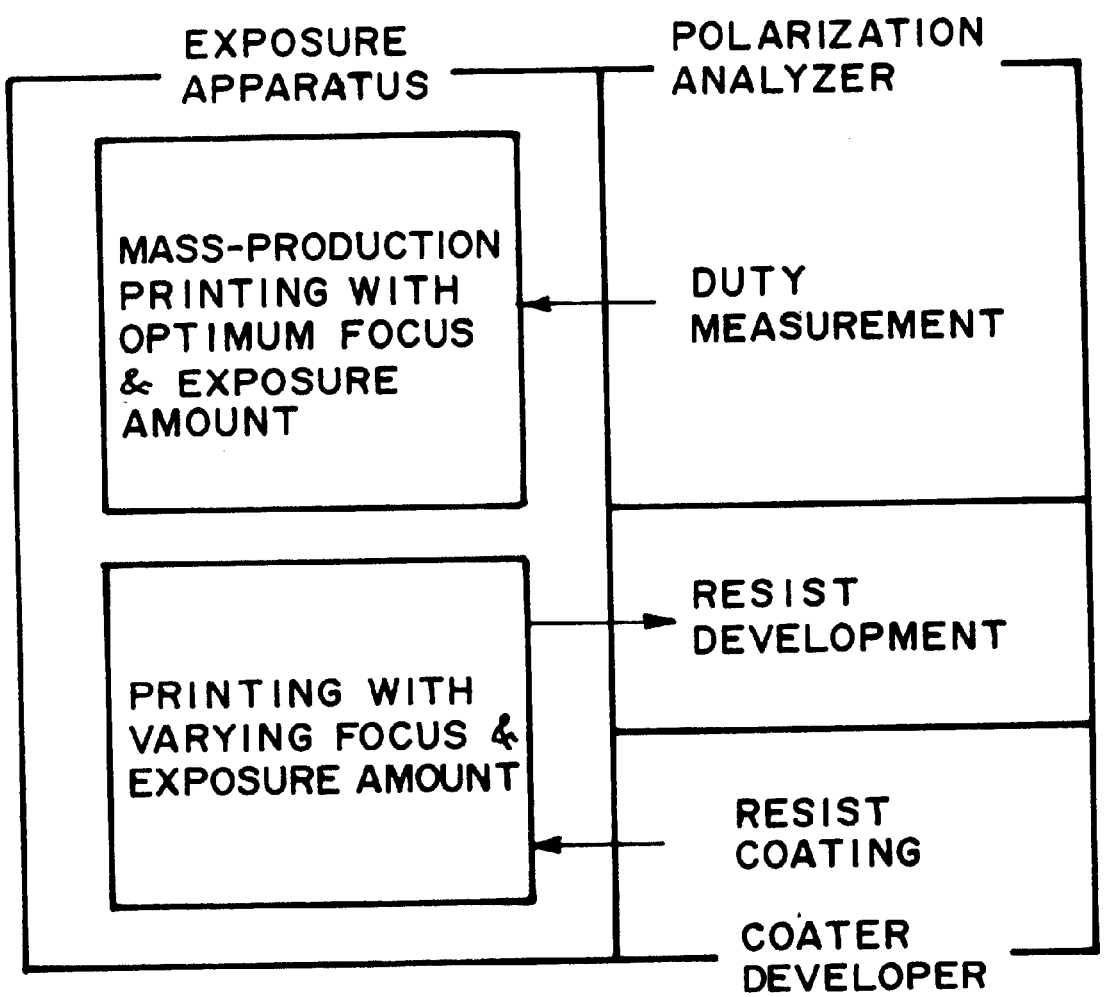
FIG. 12 is a schematic view of an arrangement according to a further embodiment of the present invention, wherein a polarization analysis system is disposed separately.

FIG. 11 is a schematic view of a fourth embodiment of the present invention. This embodiment differs from the first embodiment only in point that, in consideration of an occasion where there is some physical limitation within an exposure apparatus, a polarization analysis system is provided separately from a wafer stage of the exposure apparatus. The remaining portion has the same structure as of the first embodiment. FIG. 12 illustrates a modified example of this embodiment. As compared with the fourth embodiment wherein polarization analysis is made to a latent image without development of a resist of a wafer, in the illustrated example a resist is developed and, thereafter, polarization analysis is performed.

Fifth Embodiment

A fifth embodiment of the present invention is an example wherein measurement is made with use of different incidence angles for a single sensitized pattern. As compared with the first embodiment wherein one optimum incidence angle is determined on the basis of preparatively measured refractivities n1 and n2 of unexposed and exposed portions, resist thickness d and complex refractivity ns of the substrate, in the present embodiment light is projected with different incidence angles and changes in light are detected. Thus, by using detected values with different incidence angles, high-precision measurement is assured.

In accordance with this embodiment of the present invention, the refractivities n1 and n2 of an unexposed portion and exposed portion, the resist thickness d and the complex refractivity ns of the substrate, having been measured beforehand, are used to chose plural incidence angels close to an optimum incidence angle, and measurement is made with such incidence angles. When a certain shape of a sensitized pattern is assumed, a change in light as the light is incident at a desired incidence angle can be calculated. With respect to each of incidence angles with which measurement has been done, a change in light which is based on calculation with a certain duty t assumed and a change in light obtained through actual measurement are compared with each other. If, for example, the measurement is done with three incidence angles θ1, θ2 and θ3, the duty t may be so determined that a function which uses ratios ø1, ø2 and ø3 of P-polarized light and S-polarized light obtained through measurement, phase differences Δ1, Δ2 and Δ3 of P-polarized light and S-polarized light, ratios ø1'(t), ø2'(t) and ø3'(t) of P-polarized light and S-polarized light obtained with calculation, and phase differences Δ1'(t), Δ2'(t) and Δ3'(t) of P-polarized light and S-polarized light, i.e., the following function becomes minimum:

$$D(t)=\{ø1-ø1'(t)\}+\{ø2-ø2'(t)\}+\{ø3-ø3'(t)\}+\{Δ1-Δ1'(t)\}+\{Δ2-Δ2'(t)\}+\{Δ3-Δ3'(t)\}$$

In this manner, the duty t can be measured precisely.

Further, since the film thickness of a resist varies as a result of exposure or development as is known in the art, optimization of incidence angle with respect to a thickness d measured beforehand does not necessarily result in determination of an optimum incidence angle. Since the state of polarization is variable even with the film thickness, for determination of the duty, the thickness d may be added as a parameter for calculation, and the duty t and thickness d may be so determined that the following function becomes minimum:

$$D(t)=\{ø1-ø1'(t,d)\}+\{ø2-ø2'(t,d)\}+\{ø3-ø3'(t,d)\}+\{Δ1-Δ1'(t,d)\}+\{Δ2-Δ2'(t,d)\}+\{Δ3-Δ3'(t,d)\}$$

In this manner, the shape of a sensitized pattern can be measured more exactly. When the shape of a resist is to be determined practically, in consideration of many parameters it is desirable to perform the measurement through detected values obtained with use of different incidence angles. The remaining portion of this embodiment has substantially the same structure as of the first embodiment.

Sixth Embodiment

A sixth embodiment of the present invention is an example wherein measurement is made with use of different incidence directions for a single sensitized pattern. The direction of incidence refers to an incidence azimuth angle of a plane of incidence as defined by an optical axis of projected light and a normal to a sensitized pattern, with respect to a certain direction on the surface of the sensitized pattern. Similarly to the second embodiment, this embodiment includes in FIG. 2 a rotational stage (not shown) disposed below the X-Y stage underneath the wafer chuck 14. After a sensitized pattern which is the subject of measurement is moved to the position of a projected light spot, polarization analysis is performed.

Light is projected to a pattern, in X direction. After this, the rotational stage is moved to rotationally move the sensitized pattern along X-Y plane by 90 deg. around the point of incidence of light, and measurement is made again with use of an incidence direction perpendicular to that in the preceding measurement operation.

The present embodiment meets a variation of measured value due to any resist unevenness or to the structure of an underlying substrate. More specifically, to polarization analysis measurement in a certain direction, second measurement is made to substantially the same measurement point in the preceding measurement in an incidence direction perpendicular to the direction in the preceding measurement. By doing so, precision can be increased as follows.

In this case, similarly to determination of t in the first embodiment, $$t(90\ deg.)=(t\bot+t\|)/2$$

By using t(0 deg.) calculated in the first embodiment, an average is determined:

$$t-\{t(0\ deg.)+t(90\ deg.)\}/2$$

In this manner, measurement precision of duty t can be increased.

Also, for measurement to details of a shape of a pattern, not only measurement analysis in two directions of the plane of incidence parallel to grooves of a sensitized pattern and of the plane of incidence perpendicular to it, but also measurement analysis in an incidence direction intermediate between the two directions, may be required.

Similar advantageous result may be accomplished by using, in place of a rotational stage below a wafer X-Y stage, a driving system rotatable about an axis of normal to the wafer, passing the point of incidence upon the arch 36 in FIG. 2. The remaining portion of the present embodiment has substantially the same structure as of the first embodiment.

Seventh Embodiment

A seventh embodiment of the present invention is an example wherein measurement is made with use of different wavelength for a single sensitized pattern. This embodiment is similar to the third embodiment and, in the structure of FIG. 2, the light source for the light source means 31 is provided by a combination of a halogen lamp and a spectroscope, for example.

In the third embodiment, measurement is done with one optimum incidence wavelength corresponding to a value or values of the subject of measurement, such as the underlying substrate, the refractivities n1 and n2 of unexposed and exposed portions of resist, the resist thickness d, the period, angle, number of lines of the exposed pattern, for example. In the present embodiment, as compared therewith, plural wavelengths are applied and changes in light are detected. By using a detected value obtained with use of plural wavelengths, high precision measurement is enabled.

In accordance with the present embodiment, plural wavelengths near an optimum wavelength are selected on the basis of preparatively measured values related to the subject of measurement, such as underlying substrate of resist, refractivities n1 and n2 of unexposed and exposed portions of the resist, thickness d, and period, angle and number of lines of the exposure pattern, for example. The measurement is made by use of these wavelengths.

When a certain shape of a sensitized pattern is assumed as in the fifth embodiment, changes in light as a desired wavelength of light is applied can be calculated. With respect to each of the wavelengths applied, a change in light which is based on calculation with a certain duty t assumed and a change in light obtained through actual measurement are compared with each other. If, for example, changes in the state of polarization is measured with use of three wavelengths λ1, λ2 and λ3, the duty t may be so determined that a function which uses ratios ø1, ø2 and ø3 of P-polarized light and S-polarized light obtained through measurement, phase differences Δ1, Δ2 and Δ3 of P-polarized light and S-polarized light, ratios ø1'(t), ø2'(t) and ø3'(t) of P-polarized light and S-polarized light obtained with calculation, and phase differences Δ1'(t), Δ2'(t) and Δ3'(t) of P-polarized light and S-polarized light, i.e., the following function becomes minimum:

$$D(t)=\{ø1-ø1'(t)\}+\{ø2-ø2'(t)\}+\{3-ø3'(t)\}+\{\Delta1-\Delta1'(t)\}+\{\Delta2-\Delta2'(t)\}+\{\Delta3-\Delta3'(t)\}$$

In this manner, the duty t can be measured precisely.

Since the thickness of a resist varies due to exposure or development as is known in the art, there may be cases where use of the resist thickness d measured beforehand with respect to a portion having no pattern is inappropriate for calculation. In the present embodiment, measurement is made with use of plural wavelengths and this enables simultaneous measurement of the duty and the resist shape as well as the resist thickness at the pattern position.

Further, since the state of polarization varies with the film thickness, for determination of the duty as described, the thickness d may be added as a parameter for calculation, and the duty t and thickness d may be so determined that the following function becomes minimum:

$$D(t)=\{ø1-ø1'(t,d)\}+\{ø2-ø2'(t,d)\}+\{ø3-ø3'(t,d)\}+\{\Delta1-\Delta1'(t,d)\}+\{\Delta2-\Delta2'(t,d)\}+\{\Delta3-\Delta3'(t,d)\}$$

In this manner, the shape of a sensitized pattern can be measured more exactly. When the shape of a resist is to be determined practically, in consideration of many parameters it is desirable to perform the measurement through detected values obtained with use of different incidence angles.

Similar advantageous result of measurement based on plural wavelengths of projected light is attainable with an arrangement wherein light from a halogen lamp is passed through a spectroscope and, by using an optical fiber, the light from an exit port of the spectroscope is directed to the light source means. Further, a light source which provides plural wavelengths such as a tunable laser or plural light source of different wavelengths may be used with similar advantageous result. The remaining portion of this embodiment has substantially the same structure as of the first embodiment.

Eighth Embodiment

An eighth embodiment of the present invention is an example wherein a light source projects light under a given incidence condition to a single sensitized pattern, and processing means calculates an optimum incidence condition on the basis of a detected value of a change in the light. Light source then projects light under the optimum incidence condition, to determine the state of formation of the sensitized pattern.

As described, the thickness of a resist varies due to exposure or development process, and it may cause an error of measurement. In consideration of this, measurement is made once under an optimum incidence condition as calculated on the basis of preparatively measured valued related to the subject of measurement, such as refractivity ns of the underlying substrate of the resist, refractivities n1 and n2 of unexposed and exposed portions of the resist, thickness d, the period, angle and number of lines of the exposed pattern, for example. Then, by comparing the result of measurement with calculated values, such a numerical value (e.g., thickness) which differs from an expected value largely is corrected, and optimum incidence condition is calculated again. The light source is then adjusted with respect to the renewed optimum incidence condition, and light is projected under it. A change in light is then detected by a light receiving system, whereby a resist pattern is measured.

The incidence condition here may be incidence angle, incidence direction or incidence wavelength.

Ninth Embodiment

Next, an embodiment of device manufacturing method which uses an exposure method described above, will be explained.

Figure 16:
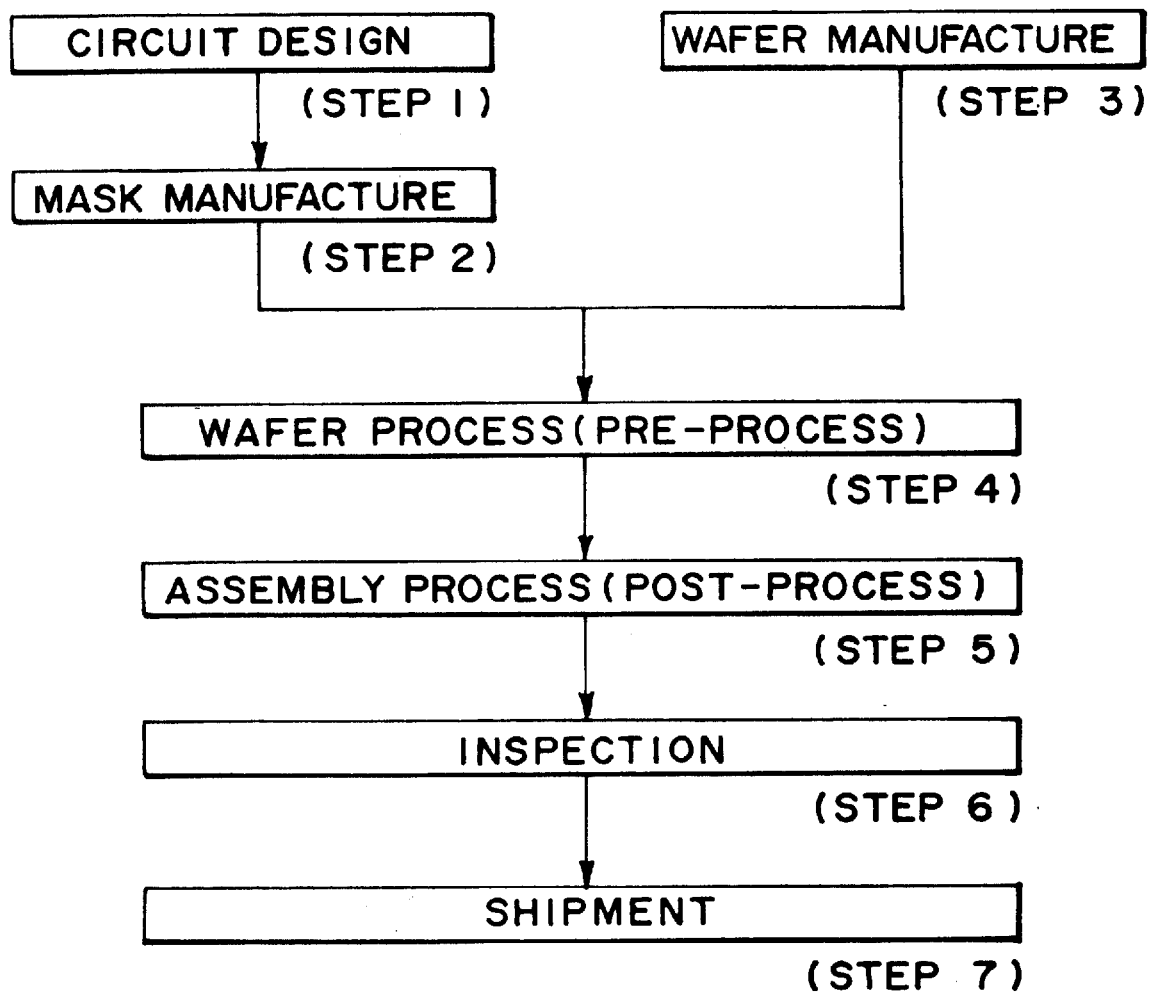
FIG. 16 is a flow chart of device manufacturing processes according to an embodiment of the present invention.

FIG. 16 is a flow chart of procedure for manufacture of microdevices such as semiconductor chips (e.g. ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes assembling (dicing and bonding) process and packaging (chip sealing) process. Step 6 is an inspection step wherein operation check, durability check and so on for the semiconductor devices provided by step 5, are carried out. With these processes, semiconductor devices are completed and they are shipped (step 7).

Figure 17:
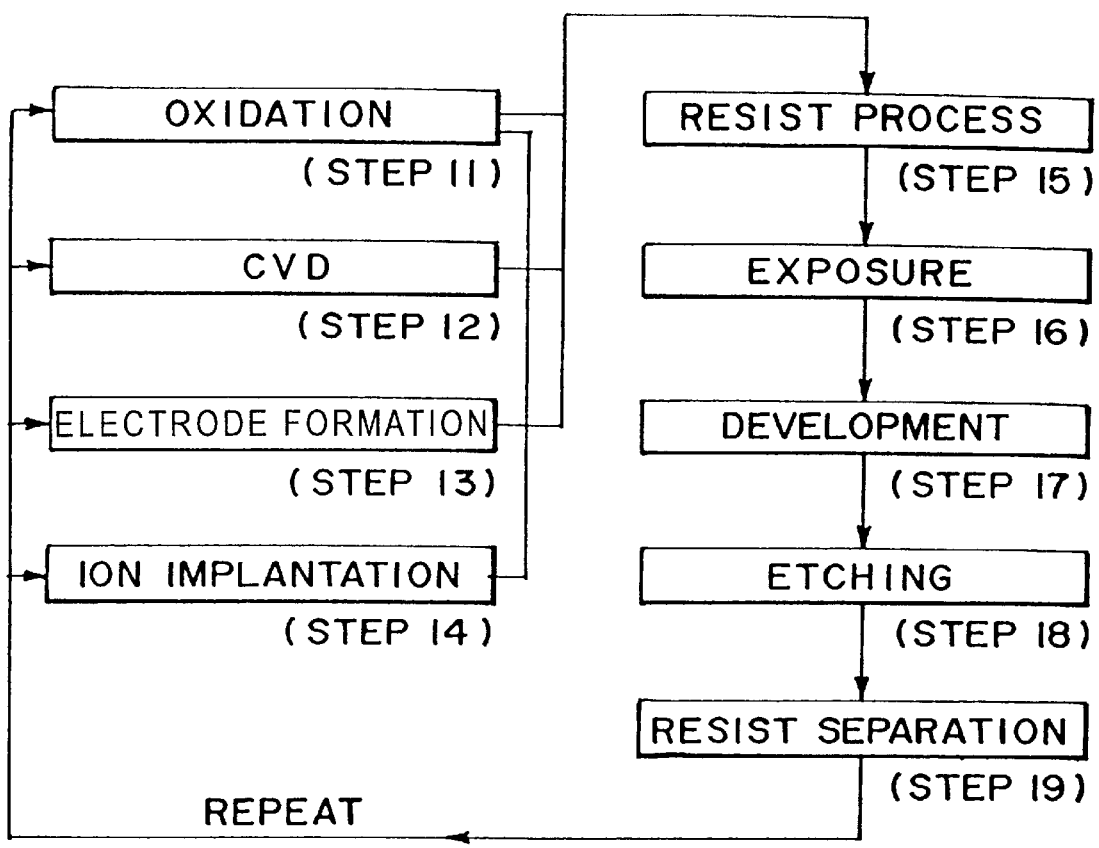
FIG. 17 is a flow chart of a wafer process included in the procedure of FIG. 16.

FIG. 17 is a flow chart showing details of the wafer process. Step 11 is an oxidation process for oxidizing the surface of a wafer. Step 12 is a CVD process for forming an insulating film 6n the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

Next, another aspect of the present invention will be explained.

Here, an important feature of measurement method according to the present invention for measurement of a pattern formed on a substrate, will be explained.

An embodiment of the present invention is based on a principle that an average refractivity or effective value thereof of a pattern varies with a change in shape of the pattern.

More specifically, in the present invention, as a reticle (R), a mask with a patter for process control, comprising a line-and-space pattern having a periodicity in one direction, for example, is used, and images of such reference pattern are printed sequentially onto a wafer (W).

Latent image in the resist material on the wafer defined through this exposure process (i.e., an image defined by a portion whose refractivity has been changed due to chemical change caused by exposure) or a protrusion-recess pattern (rectangular-wave-like pattern) on the wafer formed after a development process is then irradiated with input light from a light projecting means. Signal light from the pattern is received by light receiving means. By using a signal from the light receiving means, a change in input light (change in state of polarization of input light or change in intensity of it) are detected. On the basis of detection of a change in light corresponding to the light incidence condition, the state of formation of the pattern is detected through processing means.

Now, an example of such a change of light will be taken, with reference to a case where the state of polarization of input light changes, and measurement of a resist pattern on a wafer will be explained.

For a pattern, light having a predetermined wavelength and a predetermined state of polarization is projected on to a resist with a predetermined angle of incidence. The light is transmitted through the resist. The light is reflected by the surface of the wafer bottom substrate, and it is transmitted again through the resist. The light going out of the resist is combined with the light having been directly reflected by the surface of the resist. The state of polarization of such combined light is measured.

It is known that, for a protrusion-recess pattern phase type diffraction grating, no diffraction light is produced with a wavelength longer than the pitch thereof, and it has a double refraction characteristic.

In an embodiment of the present invention, description will be made mainly on a case where reflection light is detected. However, if the pitch of a resist pattern is larger than the wavelength, diffraction light is produced. Similar measurement is attainable with such diffraction light.

Now, a polarization analysis method used in the present invention will be explained.

It is now assumed that grating thickness is d and duty ratio (the ratio of a remaining resist portion to the period) is t, and also that laser light having a wavelength greater than the period is perpendicularly incident on a double refraction element. Here, it is known that, depending on whether the state of polarization of the input or projected light is parallel to or perpendicular to the grating groove, refractivities $n\|$ and $n\perp$ in the periodic structure portion of the double refraction element are given by the following equations. When effective refractivity with respect to light parallel to the grating groove is $n\|$, and effective refractivity with respect to light perpendicular to the grating groove is $n\perp$, then:

$$n\| = \sqrt{(t \cdot n1^{}2 + (1-t) \cdot n2^{}2)}$$

$$n\perp = 1/\sqrt{((t/n2^{}2) + (1-t)/n2^{}2))}$$

where n1 and n2 are refractivities of the line portion and of the space portion of the grating. The line portion L and the space portion S are such that, for a case of resist latent image, L corresponds to a resist and S corresponds to an exposed resist. When the resist is developed, L corresponds to a resist and S corresponds to a gas such as an air.

The equations of refractivity mentioned above are approximation equations in a case where the period of the periodic structure is sufficiently small as compared with the wavelength. If the electric field is calculated exactly, the refractivity can be calculated also in a case where the period is the same as or similar to the wavelength or a case where a structure other than a periodic structure is used.

A model of polarization analysis corresponds to measurement double refractivity of a double refractivity medium of a predetermined thickness, on a wafer substrate. The polarization analysis method is such that rectilinearly polarized light having a zero P/S phase difference (between P-polarization and S-polarization) and having an amplitude ratio of 1 is projected upon a wafer substrate, such as above, with a predetermined angle θ, and phase difference (Δ) and amplitude ratio (ø) of reflected light therefrom are measured, to thereby determine $n\|$ and $n\perp$. Then, from the refractivities n1 and n2 of the line portion L and of the space portion S, having been measured beforehand, and from the resist thickness d, the values of $n\|$ and $n\perp$ are determined. Then, on the basis of the values $n\|$ and $n\perp$ determined in accordance with the polarization analysis method described above, duty t is determined by use of the equation mentioned above or the equation solved exactly. Since such polarization analysis method is known in the art, description of details of it will be omitted.

As regards the light incidence condition (e.g., incidence angle, azimuth angle with respect to pattern direction, wavelength), optimum condition varies with the refractivity of resist, film thickness thereof or the shape of the pattern. The condition also varies for a developed resist pattern measurement and for a latent image resist pattern measurement. Further, for a latent image, since the difference in refractivity between an exposed portion and an unexposed portion is small, in order that a minute change to be produced in pattern shape with a small change in exposure condition is resolved and detected with a small change in light, measurement may be made with such incidence condition that a large change is produced in light with the pattern formation condition.

In an embodiment of the present invention, measurement is made to a photosensitive substrate on which a line-and-space pattern is formed, this being done prior to a development process. After the development process, measurement is made again, and results are compared with each other. On the basis of this, if there is produced a wafer with non-uniformness of pattern or with a pattern not having a predetermined shape, whether the cause is involved in the development process or not is discriminated.

Tenth Embodiment

Figure 18:
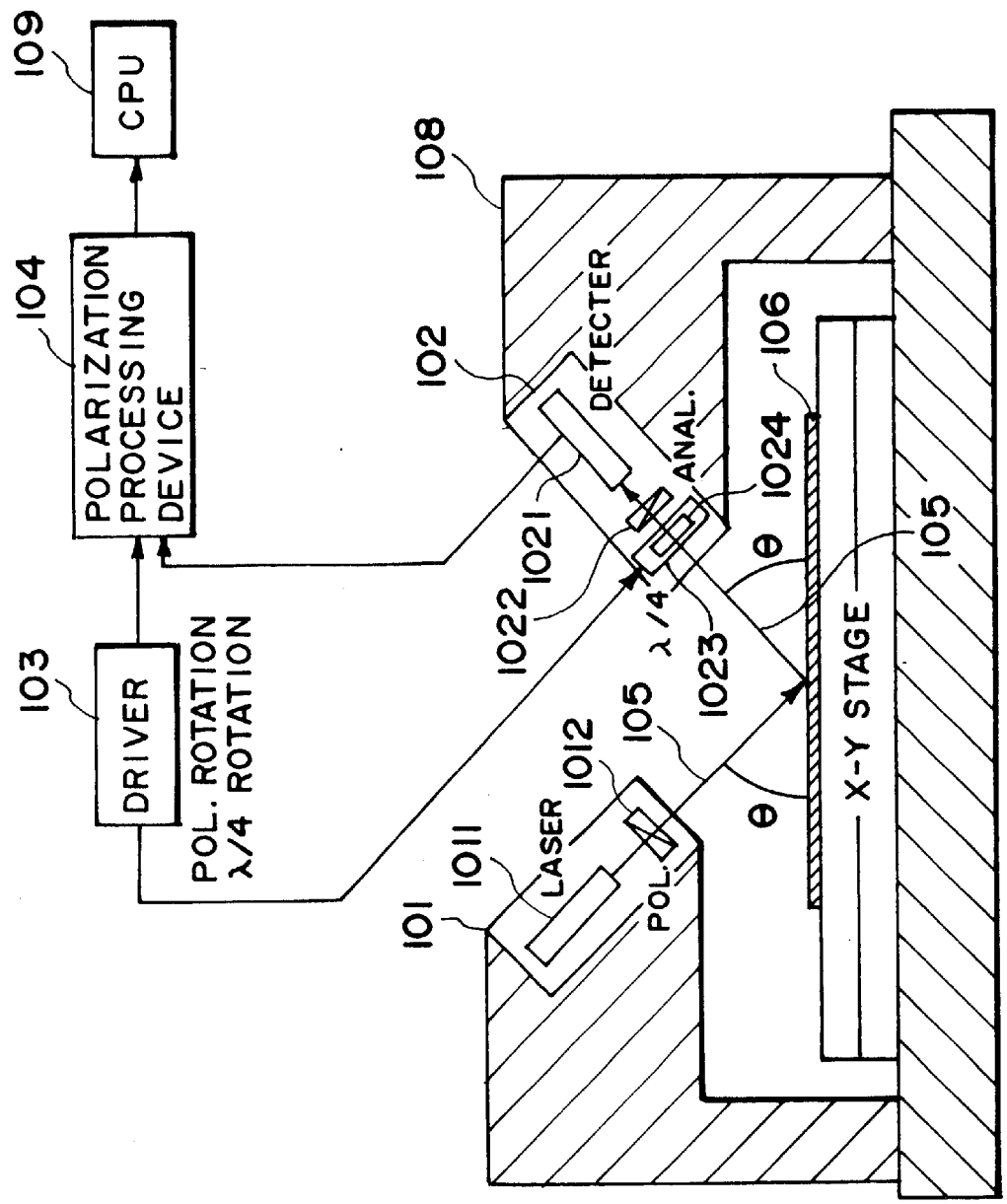
FIG. 18 is a sectional view of a main portion of an arrangement according to an embodiment of the present invention.

FIG. 18 is a schematic view of a main portion of a tenth embodiment of the present invention, and FIG. 2 illustrates an example of a pattern.

This embodiment is an example wherein, as a change in projected light through a sensitized pattern, a change in state of polarization is taken and, based on it, any disorder of or failure in an exposure process and a development process can be detected separately.

Figure 19:
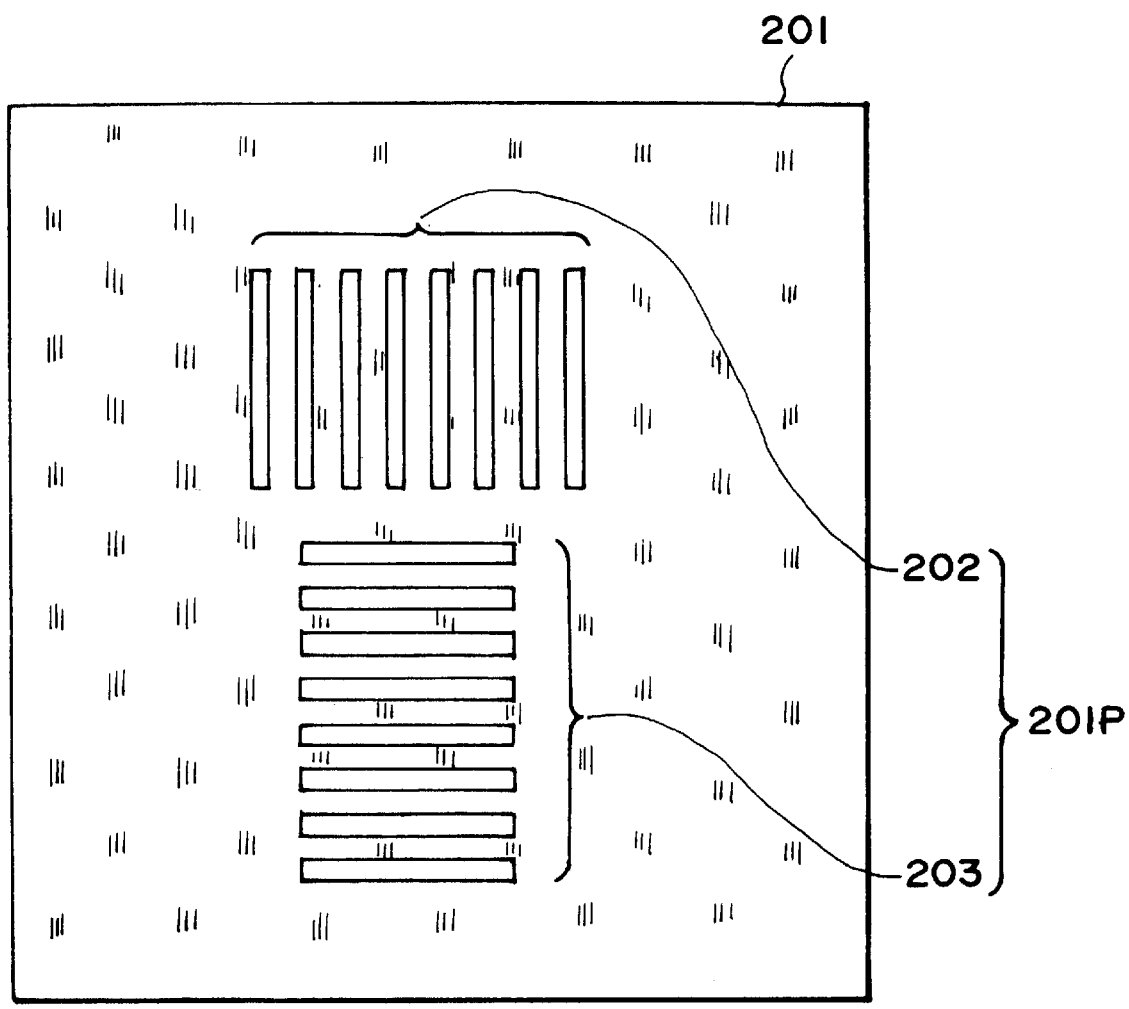
FIG. 19 is an enlarged top plan view of a measurement pattern.

FIG. 19 illustrates a reference pattern 201p on the surface of a reticle. The reference pattern 201p comprises orthogonally arrayed line-and-space patterns 202 and 203 each being provided by lines (L) and spaces (S).

In this embodiment, the pattern 201p comprising line-and-space patterns 202 and 203 formed on the reticle is printed successively on a wafer 106, coated with a resist, in accordance with step-and-repeat method.

Figure 20:
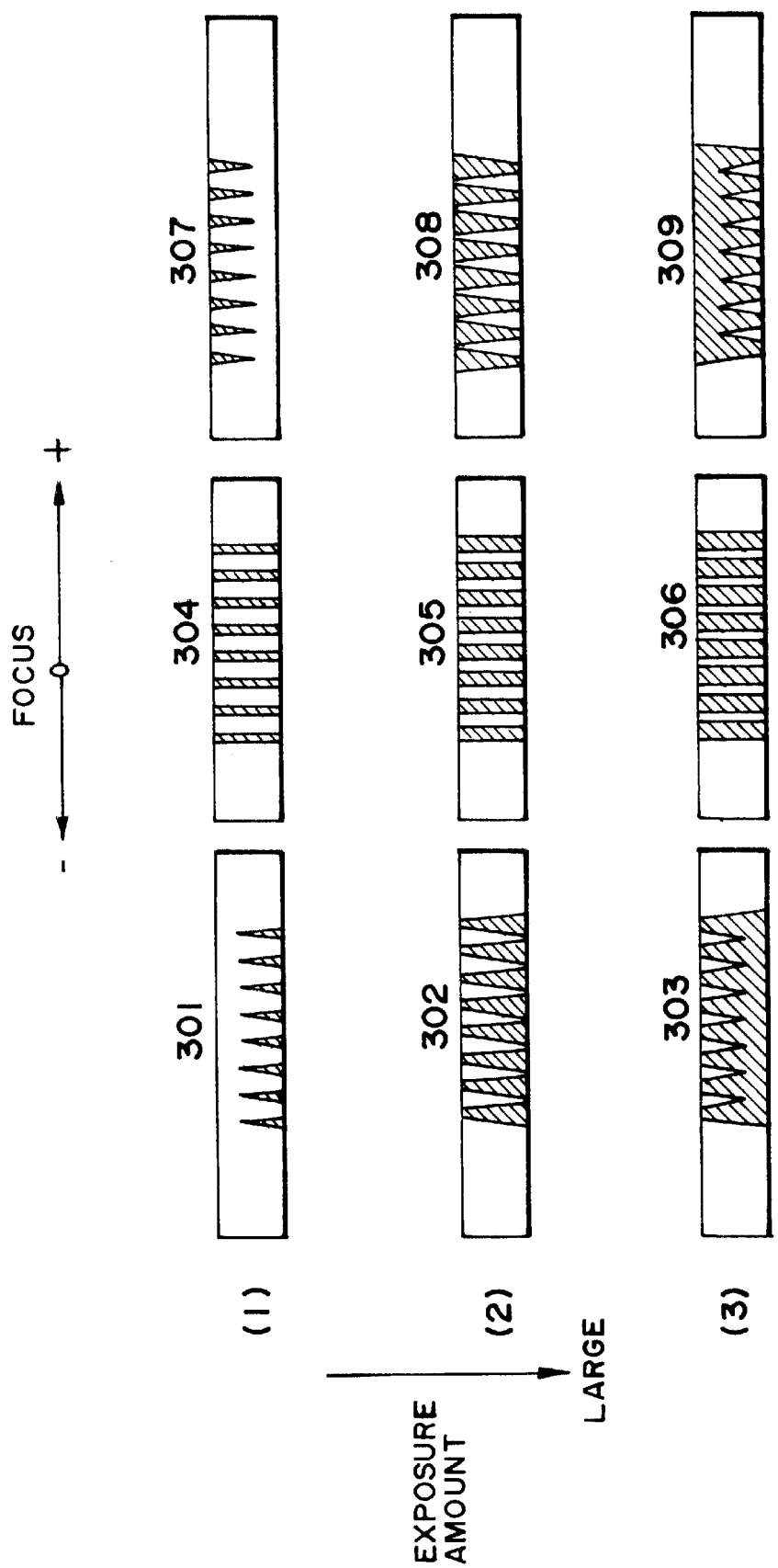
FIG. 20 is a schematic view for explaining resist latent images, in section.

FIG. 20 illustrates sections of a resist. Within a resist on the wafer 106 after it is exposed, there are latent images formed such as shown in FIG. 20. The latent image is defined by a change in property of a resist resulting from a chemical change, for example, caused by irradiation with exposure light. Hatched portions depict exposed portions and, generally the refractivity has been changed in these portions. Reference numeral 305 in FIG. 20 denotes a latent image as the exposure amount and focus amount (position of the wafer with respect to an optical axis direction of a projection lens), for example, are optimized. There is a pattern of a duty 0.5, formed. When the exposure amount changes, for example, if the exposure amount is less than a correct value, a latent image pattern of a duty not greater than 0.5 will be formed, such as at 304. If on the other hand the exposure amount is larger than a correct value, a latent image pattern of a duty not smaller than 0.5 will be formed, such as at 306.

Also, if the focus amount in the exposure process changes, there occurs a change in tilt of a side wall of the pattern, such as depicted at 302 or 308.

If the exposure condition in an exposure apparatus is optimized and the exposure process is performed while maintaining it constant, resultant patterns formed will have a constant shape. If any disorder occurs at this stage in the exposure apparatus, however, these latent images will have different shapes and thus results of measurement to the state of formation of the patterns will be different from each other.

Referring to FIG. 18, the pattern measurement based on detection of a change in state of polarization, will be explained.

By means of a process monitoring system which comprises a light source portion 101, a light receiving portion 102, a driver 103, a polarization processing device 104, and a CPU 109 and which is based on a polarization analysis method, amplitude ratio ø and phase difference Δ of reflected light with respect to a projected light are measured, and state of formation of the pattern is discriminated.

Figure 21:
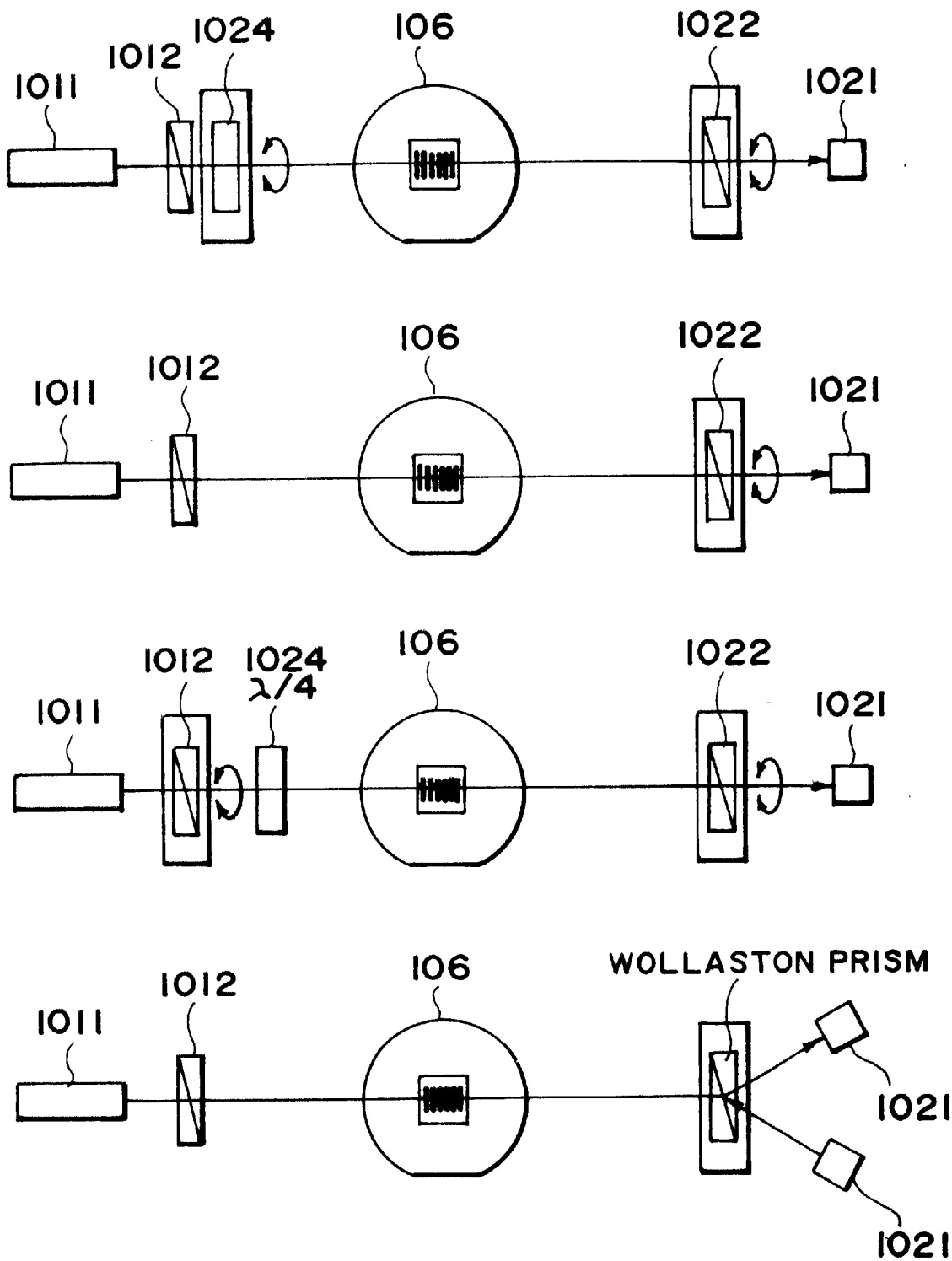
FIG. 21 is a schematic view for explaining a structure for polarization analysis.

FIG. 21 is a schematic view wherein the light path in the FIG. 18 arrangement is extended. In FIGS. 18 and 21, light source means (light projecting means) 101 comprises a light source 1011 (which may comprise a He—Ne laser or a semiconductor laser or, alternatively, monochromatic light from a spectrometer) and a polarization element 1012 such as a Glan-Thompson prism, for example. The polarization element 1012 has its polarization plane disposed at 45 deg. with respect to the sheet of the drawing, so that, with respect to the wafer 106, the same quantity of P-polarization component (parallel to the sheet of the drawing) and S-polarization component (perpendicular to the sheet of the drawing) are provided. Thus, the phase difference Δ between these P-polarized light and S-polarized light is zero, and an amplitude ratio ø is 1.

The light receiving portion (light receiving means) 102 comprises a quarter wave plate 1024 having its anisotropic axis perpendicular to the light 105, a polarization element (analyzer) 1022 such as a Glan-Thompson prism, for example, and a photoelectric converting element 1021. The quarter wave plate 1024 is held within a rotary mechanism 1023 having a rotational axis along the light 105 direction. It is rotatable at a constant speed in response to a signal from a driver 103.

Light 105 from the light source means 101 is reflected by the surface of a resist on the wafer 106 and by the surface of the wafer substrate. In combined light of these reflection lights, the phase difference Δ and amplitude ratio ø of P-polarized component and S-polarized component vary in accordance with the double refractivity n1 and n2, for example, of the resist on the wafer 106.

This light is detected by the detector 1021, by way of the rotating quarter wave plate 1024 and analyzer 1022. The polarization processing device 104 produces an electric signal of sine wave corresponding to the phase difference Δ and amplitude ratio ø. Then, from positional information of sine wave of DC component magnitude and amplitude thereof, the phase difference Δ and amplitude ø are determined.

On the basis of polarization analysis method as described and when refractivity n1 of the unexposed portion of the resist, refractivity n2 of an exposed portion thereof, thickness d of the resist, and complex refractivity ns of the substrate, having been measured beforehand, are given, the CPU 109 calculates $n\perp$ with the line-and-space resist pattern taken as a double refractivity structure. Further, the duty $t\perp$ is determined from the value $n\perp$, and in accordance with the following equation:

$$t\perp = n1^{}2 \cdot (n2^{}2 - n\perp^{}2)/\{n\perp^{}2 \cdot (n2^{}2 - n1^{}2)\}$$

From the value of refractivity $n\|$, the duty $t\|$ is given by:

$$t\| = (n\|^{}2 - n2^{}2)/(n1^{}2 - n2^{}2)$$

By averaging these two values, the precision can be improved, that is:

$$t1 = (t\perp + t\|)/2$$

Figure 22:
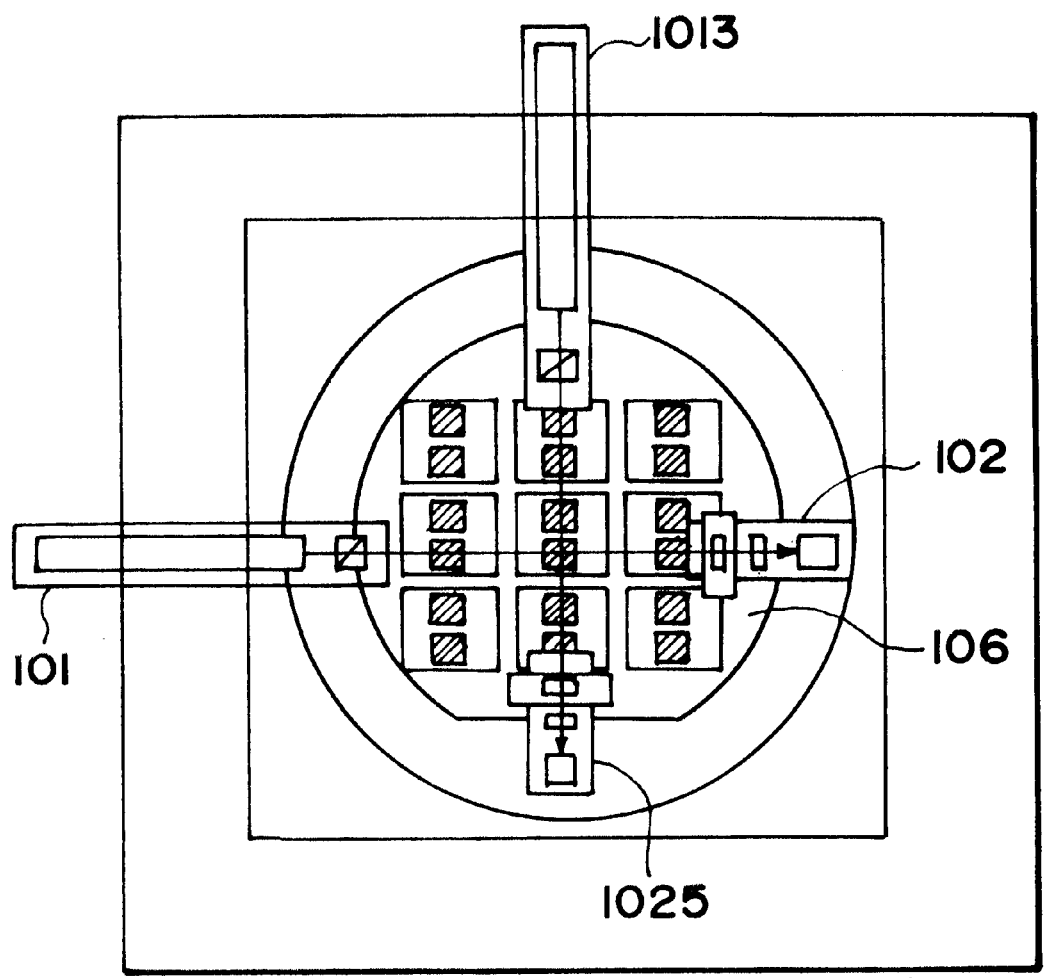
FIG. 22 is a top plan view for explaining an arrangement according to another embodiment of the present invention.

Generally, the duty t can be determined with the procedure described above. However, because of a possibility of a variation in measured value due to resist non-uniformness or underlying structure, as shown in a plan view of FIG. 22, to a polarization analysis measurement in the X direction, a second polarization analysis system (1013, 1025) in the Y direction perpendicular to it is provided to perform simultaneous measurement at substantially the same measurement point as measured by the first polarization analysis system (101, 102). The precision can be improved thereby, as follows:

Also in this case, similarly to determination of duty t1:

$$t2 = (t\perp + t\|)/2$$

By using duty t1 described hereinbefore, an average is calculated:

$$t = (t1 + t2)/2$$

The measurement precision for duty t thus increases.

In order for enhanced precision for latent image pattern measurement, a duty obtained through polarization analysis of lines and spaces of a desired pattern and a value of measurement made to a developed sample with use of a scanning electron microscope may be compared with each other to determine an offset for duty resulting from an underlying structure in the polarization analysis method. In the subsequent measurements, a value from which the offset is subtracted may be used as a correct measured value. As regards a pattern after development, with comparison of the duty obtained through polarization analysis with a measured value, any offset which depends on the process can be removed. The comparison with use of scanning electron microscope may be done only once in the initial stage when the condition such as process changes, and it is not necessary during the procedure after that.

Figure 23:
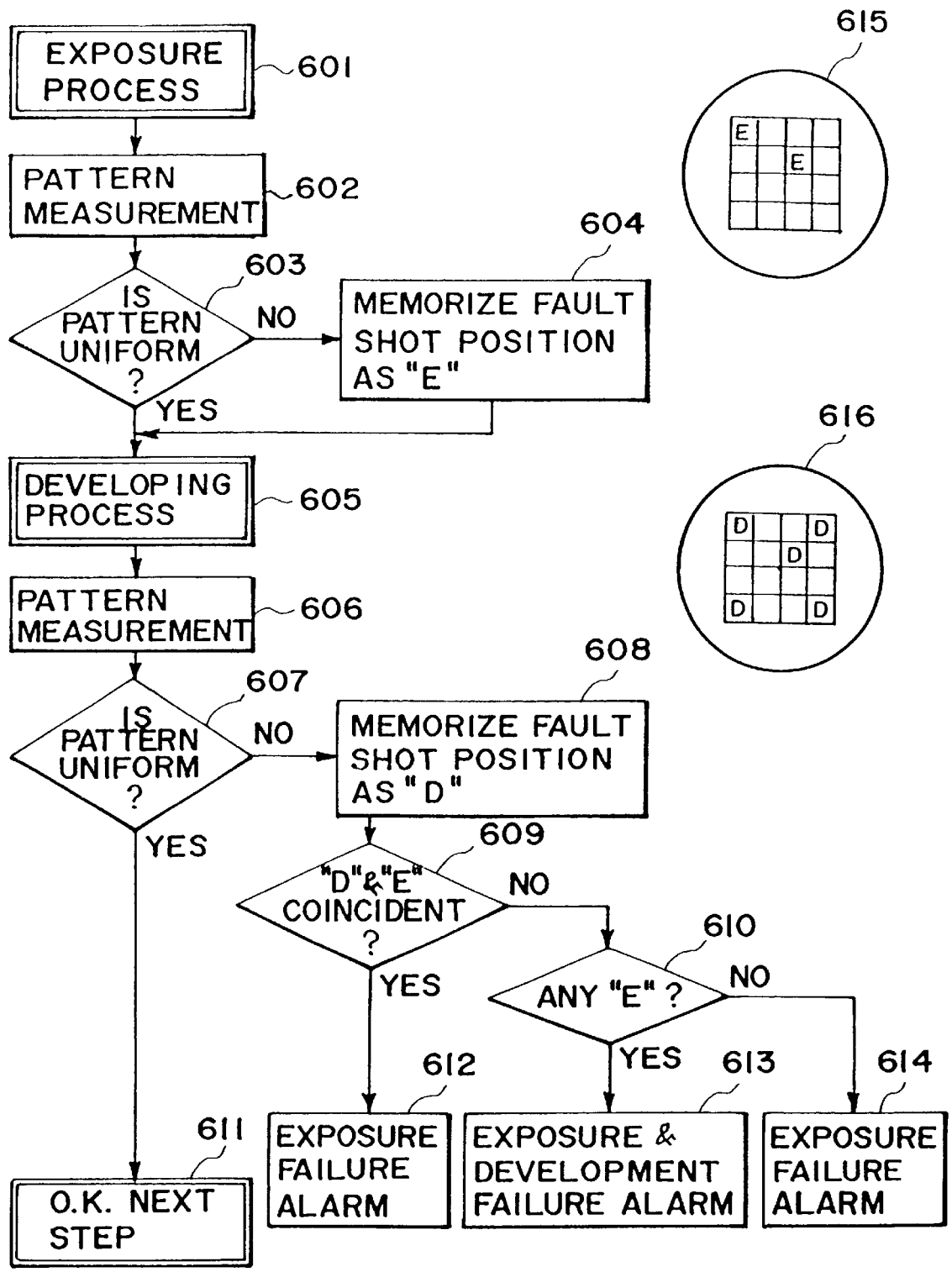
FIG. 23 is a flow chart of a procedure to be done in the arrangement of FIG. 22.

Referring now to FIG. 23, the operation of a process monitoring system which is based on detection of a change in state of polarization, will be explained.

FIG. 23 is a flow chart of procedure for a development process monitoring.

A wafer after an exposure step 601 is conveyed to a process monitor, and at 602 the polarization processing system 104 detects a phase difference Δ and an amplitude ratio ø, this being made to a latent image as described hereinbefore. On the basis of the detected phase difference Δ and amplitude ratio ø and of comparison of results of measurement to plural patterns on the wafer, the CPU 109 discriminates whether the patterns in plural shots on the wafer have been formed with a shape within a preset tolerable range. If the state of formation of the pattern is out of the tolerable range, at step 604 the shot in which defective pattern is formed is memorized as E. Reference numeral 610 denotes positions of defective shots on the wafer by E. If all the patterns have been formed in satisfactory state of formation, the wafer is directly conveyed to a development step 605. Also in cases where there is a defective shot, after step 604 the wfer is conveyed to step 605.

A wafer having been processed by the development step 605 is again conveyed to the process monitor and, at step 606, measurement is made to plural patterns on the wafer. Here, for measurement of the state of formation of a resist pattern after development, measurement condition (such as incidence angle or wavelength of projected light) and constant (such as refractivity or thickness) necessary for determination of the state of formation are different from those for the latent image pattern measurement. The method of measurement is essentially the same as the one described hereinbefore. In the case of a developed pattern, spaces of a line-and-space pattern correspond to a refractivity of a gas such as an air. At step 607, the CPU 109 discriminates whether patterns in plural shots on the wafer have formed uniformly with a shape within a preset tolerable range, this being made on the basis of comparison with the results of measurement made to plural patterns on the wafer. If the state of formation of a pattern is out of the tolerable range, the shot in which a defective pattern is formed is memorized as D. Reference numeral 616 denotes positions of defective shots produced during the development process, at D. If all the patterns are in satisfactory range of state of formation, it is concluded that patterns are formed with no disorder in the development process, and the wafer is conveyed directly to a subsequent step 611.

If there is a defective shot, the procedure goes to step 609, and the CPU 109 compares the positions of shots E for which non-uniformness of pattern before the development process has been memorized, with positions of shots D for which non-uniformness of pattern after development process. If they are coincident with each other, the non-uniformness, that is, the formation of defective pattern is attributable only to the exposure process. Thus, it is concluded that a disorder is involved in the exposure step, and an alarm is given to an operator. If the positions are not coincident with each other, at step 610, discrimination is made as to whether there is any E shost or not. If there is any E, failuer of uniform shot may be attributed to both the exposure process and the development process. Thus, it is concluded that both of these processes involve disorder, and an alarm is given to the operator. If there is no E, it is concluded that any disorder is involved only in the development process, and a corresponding alarm is given to the operator.

In the present embodiment as described above, if there is defectiveness in pattern formation, whether it has been caused in the exposure process or in the development process is detected separately as illustrated in FIG. 23. Further, when a disorder occurs in respective processes, an alarm is given so that the operator can meet the problem promptly.

Figure 24:
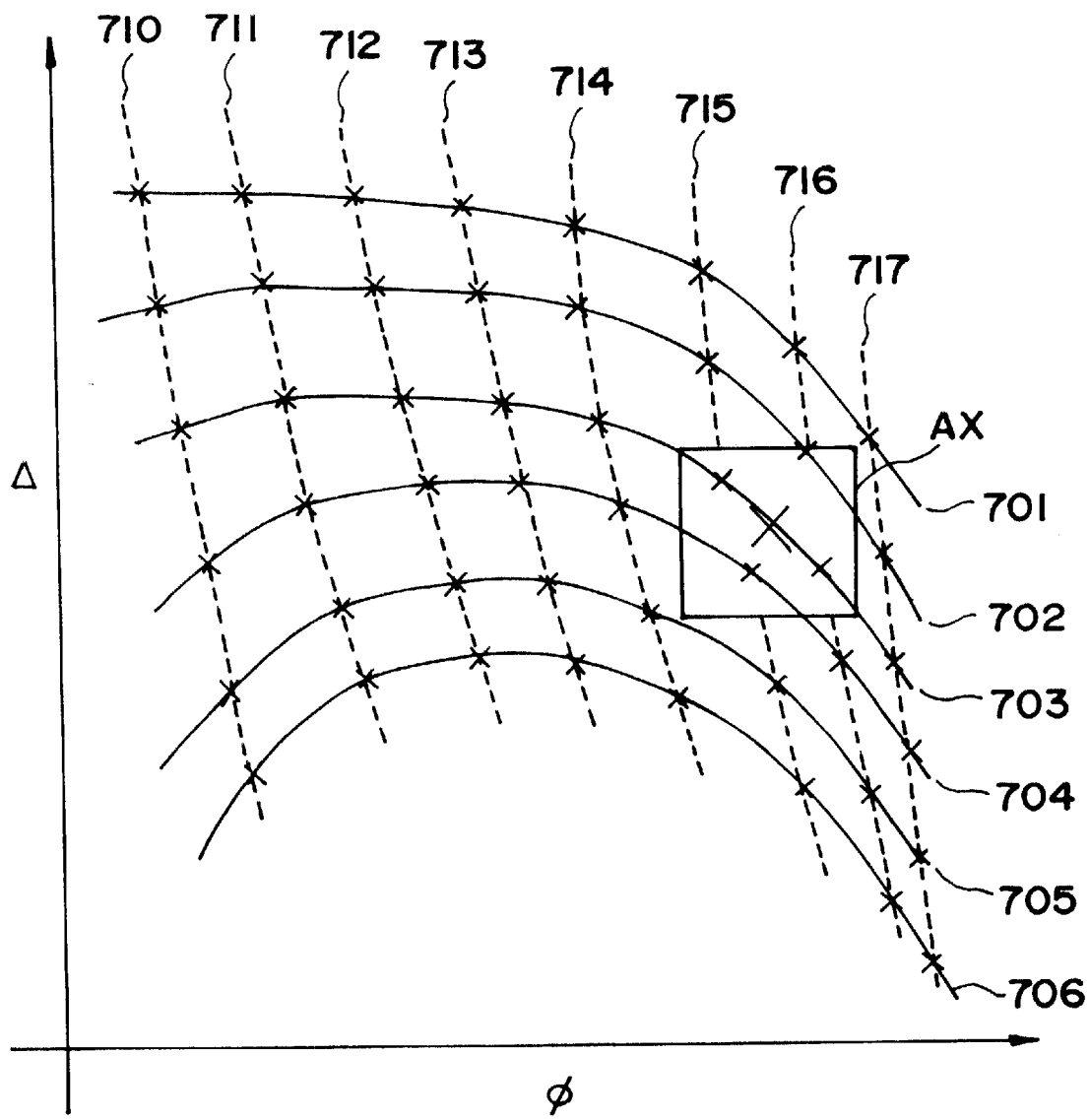
FIG. 24 is a graph for explaining a tolerable range for pattern measurement with a polarization analysis system.

Referring to FIG. 24, a tolerable range for pattern measurement will be explained. This is one method for preparing, as initial data for process monitoring in this embodiment, such data which is to be possessed by the process monitor. FIG. 24 shows an example wherein, to a single wafer, shot exposures of 8×6 are performed while successively changing by a small amount the the exposure amount along one direction and the focus amount along a direction perpendicular to it, wherein results of polarization analysis at points 8×6 before development process are illustrated in Δ-ø map. For example, as regards measurement points along a line 710, the exposure amount is kept constant while the focus varies. On the other hand, as regards measurement points along a line 701, the focus is kept constant while the exposure amount varies.

As regards these points 8×6, by taking correlation with scanning electron microscope measurement after the development process as described, a range of optimum duty can be specified as a rectangular frame AX in the Δ-ø map before the development process. Similarly, by taking correlation between the results of polarization analysis after development and scanning electron microscope measurement, a range of optimum duty can be specified also as a rectangular frame AX in the Δ-ø map after development process. As a matter of course, the rectangular frame in the Δ-ø map for optimum duty is different, before and after the development process. Thus, the CPU 109 of the process monitoring system measures the exposed shots by polarization analysis method and, if Δ and ø are within this frame AX, it is concluded that they are within a tolerable range, representing an optimum duty. In association with each of processes, the data for rectanguar frame of optimum duty in the Δ-ø map be stored in the apparatus. In that occasion, pattern comparison may be made without using values of duty t or the like, but direct comparison may be made with use of measured data such as Δ and ø, for example, before calculation. This effectively saves calculation time.

In this embodiment as described above, if any disorder occurs in the exposure process and/or the development process, the occurrence of such disorder in either process can be detected separately and promptly. Thus, it contributes to increases in yield of device mass-production procedure.

Eleventh Embodiment

An eleventh embodiment of the present invention is an example wherein an etching process is to be monitored. The etching process is a step in which, by using a resist having been developed as a mask, uncovered portions of a substrate are removed (etched) whereby a resist pattern is transferred to the substrate.

The pattern measurement is made essentially in the same method as of the tenth embodiment. However, since as regards the pattern after the etching process, there is a resist pattern which overlaps with the pattern of the substrate, two layers of double refraction films are present. Further, if the substrate is not a dielectric material such as a silicone substrate, there will be absorption by the substrate material. Thus, calculation of pattern based on polarization analysis becomes complexed. Since in the etching process the linewidth of a resist pattern can be processed with good precision, there are cases where etching depth monitoring is desired. In such cases, since the duty or the linewidth of a resist pattern as measured before the etching process corresponds to the duty or the linewidth of the pattern of the substratrate, they may be taken as known values. Thus, by detecting the thickness of double refraction layer provided by the substrate pattern on the basis of polarization analysis, the etching depth can be detected exactly.

FIG. 25 is a flow chart of the process monitoring procedure.

First, a wafer after a development process 801 is conveyed to a process monitor, and at step 802, the polarization processing system 104 detects a phase difference Δ and an amplitude ratio ø, this being done to a latent image as described. Then, on the basis of the detected phase difference Δ and amplitude ratio ø, the CPU 109 measures the state of formation of the pattern. At step 803, from the comparison of the results of measurement to plural patterns on the wafer, the CPU 109 discriminates whether the pattens in plural shots on the wafer have been formed with a shape within a preset tolerable range or not. Alternatively, as described, discrimination may be made as to whether the phase difference Δ and the amplitude ratio ø detected are within a rectangular frame AX on the Δ-ø map of optimum duty. If the state of formation of a pattern is out of the tolerable range, at step 804 the shot having a defective pattern formed is memorized as E. Reference numeral 815 denotes positions of defective shots on the wafer, at E. If all the patterns are in the satisfactory state of formation, the wafer is conveyed directly to an etching step 805. If there is a defective shot, the wafer is conveyed after step 804 to the etching step 805.

A wafer having been processed by the etching step 805 is again conveyed to the process monitor and, at step 806, measurement is made to plural patterns on the wafer. Here, for measurement of the state of formation of a resist pattern after the etching process, measurement condition (such as incidence angle or wavelength of projected light) and constant (such as refractivity or thickness) necessary for determination of the state of formation are different from those for the latent image pattern measurement. The method of measurement is essentially the same as the one described hereinbefore. At step 807, the CPU 109 discriminates whether patterns in plural shots on the wafer have formed uniformly with a shape within a preset tolerable range, this being made on the basis of comparison with the results of measurement made to plural patterns on the wafer. If the state of formation of a pattern is out of the tolerable range, the shot in which a defective pattern is formed is memorized as D, at step 808. Reference numeral 816 denotes positions of defective shots produced during the development process, at D. If all the patterns are in satisfactory range of state of formation, it is concluded that patterns are formed with no disorder in the development process, and the wafer is conveyed directly to a subsequent step 811.

If there is a defective shot, the procedure goes to step 809, and the CPU 109 compares the positions of shots E for which non-uniformness of pattern before the etching process has been memorized, with positions of shots D for which non-uniformness of pattern after the etching process. If they are coincident with each other, the non-uniformness, that is, the formation of defective pattern is attributable only to the development process. Thus, it is concluded that a disorder is involved in the development step, and an alarm is given to an operator. If the positions are not coincident with each other, at step 810, discrimination is made as to whether there is any E shost or not. If there is any E, failuer of uniform shot may be attributed to both the development process and the etching process. Thus, it is concluded that both of these processes involve disorder, and an alarm is given to the operator. If there is no E, it is concluded that any disorder is involved only in the etching process, and a corresponding alarm is given to the operator.

In this embodiment as described above, if any disorder occurs in the pattern formation, whether it is attributable to a process before the etching process or to the etching process can be detected separately, as shown in FIG. 8. Also, when a disorder occurs in respective processes, an alram is given to an operator so that the operator can meet the problem promptly. Thus, it contributes to increases in yield of device mass-production procedure.

Twelfth Embodiment

A twelfth embodiment of the present invention is an example where an ashing process is to be monitored. The ashing process is a step for removing a resist after an etching process to uncover the substrate pattern, and it is a simple and final process in pattern formation.

The pattern measurement is made essentially in the same manner as of the tenth embodiment.

Figure 26:
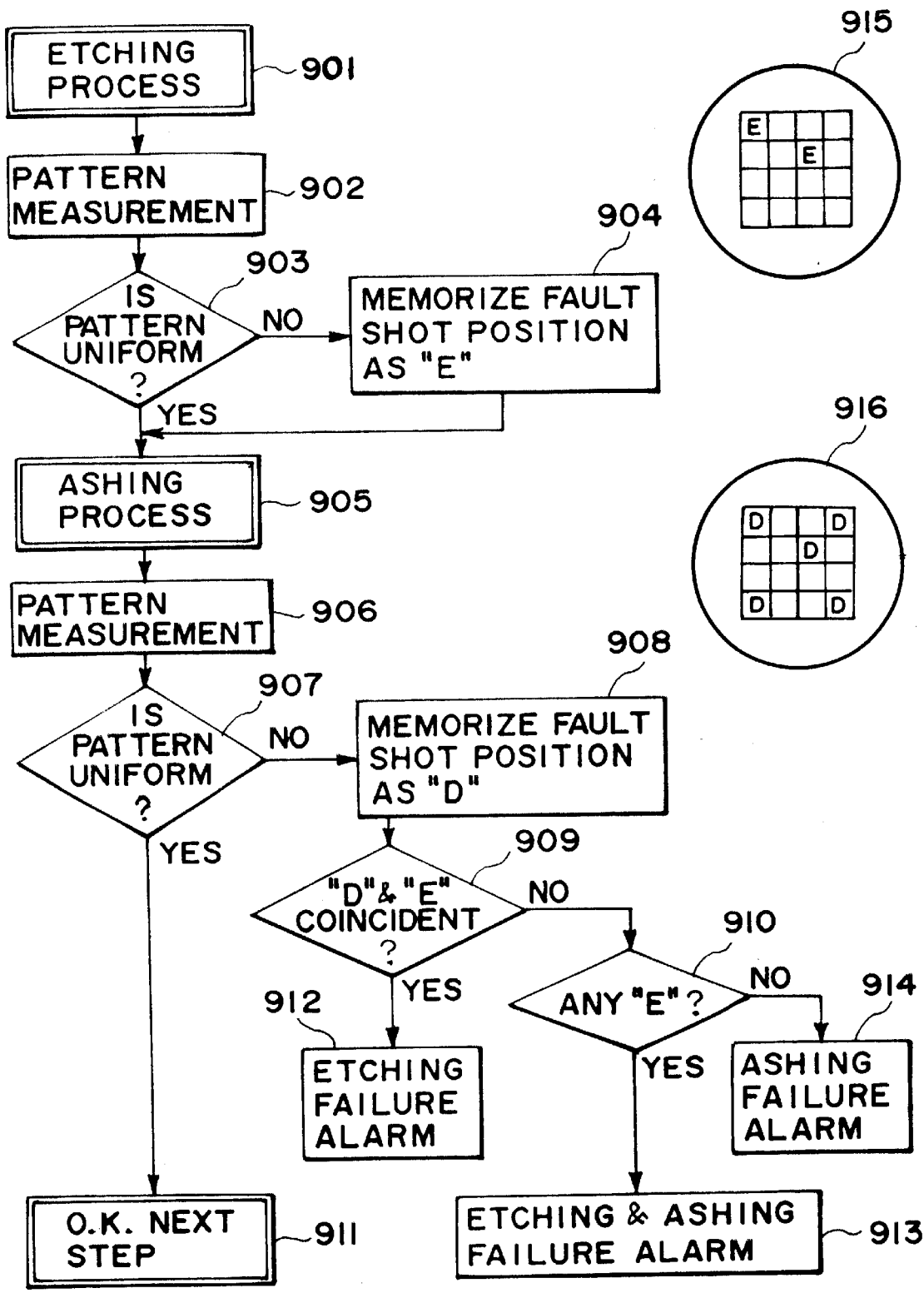
FIG. 26 is a flow chart of a procedure to be done in a further embodiment of the present invention.

FIG. 26 is a flow chart of the process monitoring procedure.

First, a wafer after an etching process 901 is conveyed to a process monitor, and at step 902, the polarization processing system 104 detects a phase difference Δ and an amplitude ratio ø with respect to a pattern defined by the resist and substrate of the wafer. Then, on the basis of the detected phase difference Δ and amplitude ratio ø, the CPU 109 measures the state of formation of the pattern. At step 903, from the comparison of the results of measurement to plural patterns on the wafer, the CPU 109 discriminates whether the pattens in plural shots on the wafer have been formed with a shape within a preset tolerable range or not. If the state of formation of a pattern is out of the tolerable range, at step 904 the shot having a defective pattern formed is memorized as E. Reference numeral 915 denotes positions of defective shots on the wafer, at E. If all the patterns are in the satisfactory state of formation, the wafer is conveyed directly to an ashing step 905. If there is a defective shot, the wafer is conveyed after step 904 to the etching step 905.

A wafer having been processed by the ashing step 905 is again conveyed to the process monitor and, at step 906, measurement is made to plural patterns on the wafer. Here, for measurement of the state of formation of a resist pattern after the ashing process, measurement condition (such as incidence angle or wavelength of projected light) and constant (such as refractivity or thickness) necessary for determination of the state of formation are different from those for measurement of a pattern defined by a reist and substrate material. The method of measurement is essentially the same as the one described hereinbefore. At step 907, the CPU 109 discriminates whether patterns in plural shots on the wafer have formed uniformly with a shape within a preset tolerable range, this being made on the basis of comparison with the results of measurement made to plural patterns on the wafer. If the state of formation of a pattern is out of the tolerable range, the shot in which a defective pattern is formed is memorized as D, at step 908. Reference numeral 916 denotes positions of defective shots produced during the ashing process, at D. If all the patterns are in satisfactory range of state of formation, it is concluded that patterns are formed with no disorder in the ashing process, and the wafer is conveyed directly to a subsequent step 911.

If there is a defective shot, the procedure goes to step 909, and the CPU 109 compares the positions of shots E for which non-uniformness of pattern before the ashing process has been memorized, with positions of shots D for which non-uniformness of pattern after the ashing process. If they are coincident with each other, the non-uniformness, that is, the formation of defective pattern is attributable only to the ecting process. Thus, it is concluded that a disorder is involved in the etching step, and an alarm is given to an operator. If the positions are not coincident with each other, at step 910, discrimination is made as to whether there is any E shost or not. If there is any E, failuer of uniform shot may be attributed to both the etching process and the ashing process. Thus, it is concluded that both of these processes involve disorder, and an alarm is given to the operator. If there is no E, it is concluded that any disorder is involved only in the ashing process, and a corresponding alarm is given to the operator.

In this embodiment as described above, if any disorder occurs in the pattern formation, whether it is attributable to a process before the ashing process or to the ashing process can be detected separately, as shown in FIG. 9. Also, when a disorder occurs in respective processes, an alram is given to an operator so that the operator can meet the problem promptly. Thus, it contributes to increases in yield of device mass-production procedure.

Thirteenth Embodiment

A thirteenth embodiment of the present invention is an example wherein a process monitor is arranged for universal use. In this embodiment, measurement condition and tolerable range for pattern shape, for example, may be inputted beforehand and, by doing so, the system can meet any process. The embodiment will be explained in detail with reference to FIG. 27.

Figure 27:
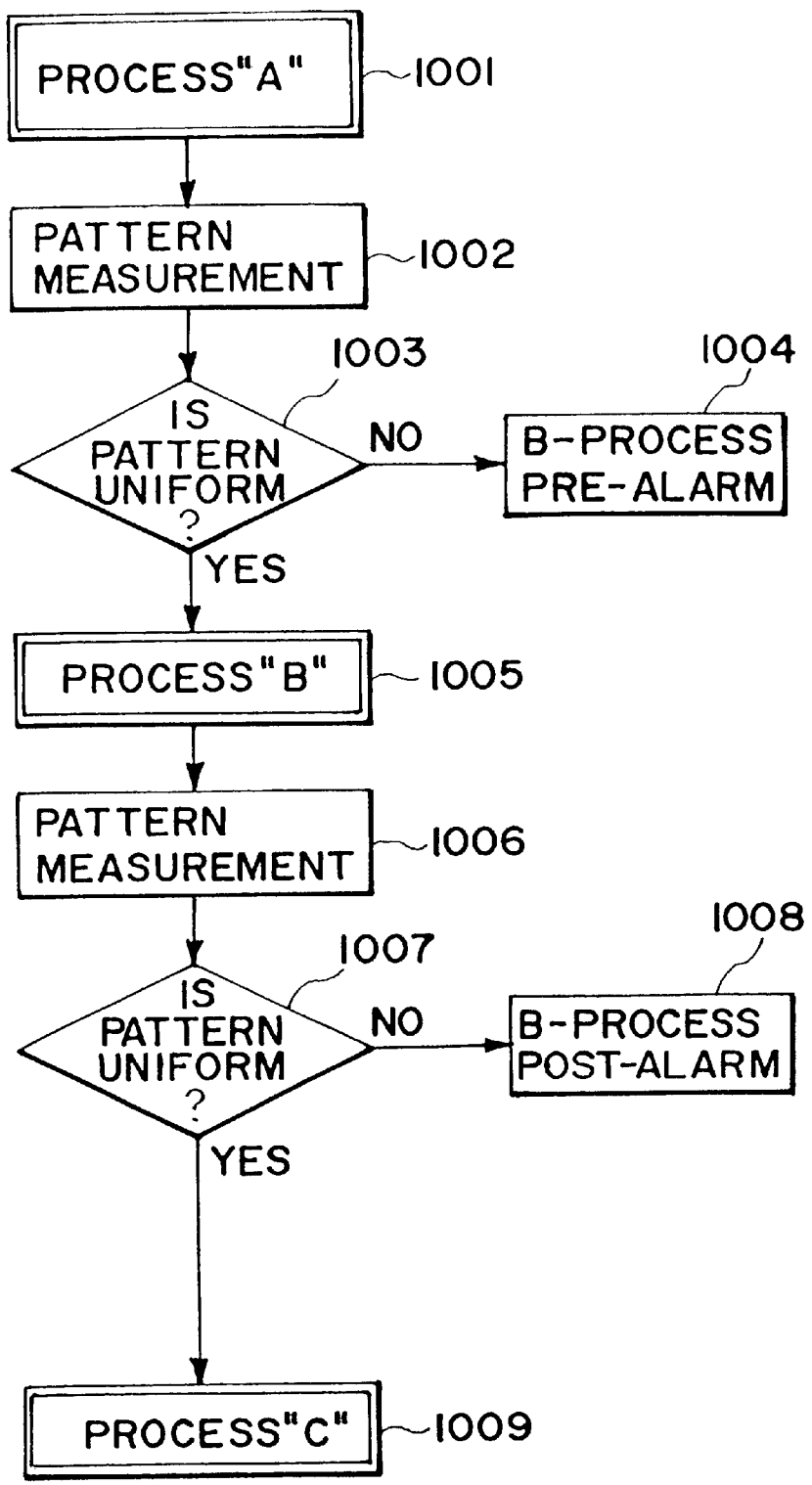
FIG. 27 is a flow chart of a procedure to be done in a still further embodiment of the present invention.

FIG. 27 is a flow chart of a process monitoring procedure. In this embodiment, pattern measurement is made before and after a given process B, by which whether any disorder has occured before the process B or in the process B can be discriminated separately. After completion of a process A and before the process B, pattern measurement is performed. The measurement is made essentially in the same manner as the preceding embodiment. That is, light is projected to a pattern, and a change in reflection light is detected, whereby the shape of the pattern is measured. Here, since the measurement condition (incidence angle or incidence wavelength, for example) and constant (refractivity or thickness, for example) necessary for determination of the state of formation; are variable with the process, measurement may be made on the basis of the condition for measurement before the process B, having been stored. Also, as regards the constant for determination of state of formation, those having been stored are used.

At step 1003, from comparison of results of measurement to patterns on a wafer, the CPU 109 discriminates whether patterns in plural shots on the wafer have been formed uniformly and with a shape within a preset tolerable range. If the state of formation of a pattern is out of the tolerable range, it is concluded that any disorder is involed before the process B, and an alarm is given to an operator, at step 1004. If there is no disorder, the wafer is simply conveyed to the process B, at step 1005.

At step 1006, pattern measuremen is repeated again. Here, the measurement condition and constants having been stored in relation to the measurement after the process B, are used. At step 1007, from comparison of results of measurement made to patterns in plural shots on the wafer, discrimination is made as to whether patterns in plual shots of the wafer have been formed uniformly and with a shape within a tolerable range.

If the state of formation of a pattern is out of the tolerable range, it is concluded that a disorder has occured in the process B, and a corresponding alarm is given to the operator, at step 1008. If there is no disorder, the wafer is simply conveyed to the process C at step 1009.

The process monitor according to the present embodiment is arranted for universal use, by which, as described above, if any disorder occurs before or after a particular process, whether the disorder has occured in either before or after that process can be detected separately. Further, when the process monitor of the present embodiment is used for every process (before and after that), any disorder occured in any process can be detected promptly. Also, when a disorder occurs in any process, an alram is given to an operator so that the operator can meet the problem promptly. Thus, it contributes to increases in yield of device mass-production procedure.

While the invention has been described with reference to the structures disclosed herein, it is not confined to the details set forth and this application is intended to cover such modifications or changes as may come within the purposes of the improvements or the scope of the following claims.

What is claimed is:

1. An inspection system for inspecting a state of a pattern formed on an object, said system comprising:

an illuminator for illuminating the pattern on the object with polarized light;

a detector for detecting, through an analyzer, polarized light from the pattern as illuminated by said illuminator and for producing a signal;

a processor for detecting a state of polarization of the light from the pattern, by use of the signal from said detector, to inspect the state of the pattern, and for producing an output; and changing means for changing a condition of the illumination by said illuminator in accordance with the output from said processor.

2. A system according to claim 1, wherein said illuminator irradiates input light with different conditions of light incidence, and said processor detects the state of formation of the pattern on the basis of a change in light under the different conditions of light incidence.

3. A system according to claim 1, wherein said illuminator irradiates input light with different conditions of light incidence, said processor determines a condition of light incidence on the basis of a change in light under the different conditions of light incidence, and said processor detects the state of formation of the pattern when said illuminator irradiates input light with the condition as determined.

4. A system according to claim 1, wherein the condition of light incidence comprises an incidence angle of input light.

5. A system according to claim 1, wherein the condition of light incidence comprises an incidence azimuth angle defined between a direction of the pattern and a plane of incidence.

6. A system according to claim 1, wherein the condition of light incidence comprises a wavelength of input light.

7. A system according to claim 1, wherein the state of formation of the pattern relates to a duty of the pattern.

8. A system according to claim 1, wherein the state of formation of the pattern relates to a sectional shape of the pattern.

9. A system according to claim 1, wherein the pattern comprises a latent image pattern before a developing process.

10. A system according to claim 1, wherein the pattern comprises a developed pattern after a developing process.

11. A projection exposure apparatus for projecting a pattern of a first object, as illuminated with exposure light, onto a second object coated with a photosensitive material, through a projection optical system to thereby form a pattern on the second object, said apparatus comprising:
- an illuminator for illuminating the pattern with polarized light;
- a detector for detecting, through an analyzer, polarized light from the pattern as illuminated by said illuminator and for producing a signal;
- a processor for detecting a state of polarization of the light from the pattern, by use of the signal from said detector, to inspect the state of the pattern, and for producing an output; and
- changing means for changing a condition of the illumination by said illuminator in accordance with the output from said processor.

12. An apparatus according to claim 11, wherein said illuminator illuminates the pattern with different conditions of light incidence, and said processor detects the state of formation of the pattern on the basis of a change in light under the different conditions of light incidence.

13. An apparatus according to claim 11, wherein said illuminator illuminates the pattern with different conditions of light incidence, said processor determines a condition of light incidence on the basis of a change in light under the different conditions of light incidence, and said processor detects the state of formation of the pattern when said illuminator irradiates input light with the condition as determined.

14. An apparatus according to claim 11, wherein the condition of light incidence comprises an incidence angle of input light.

15. An apparatus according to claim 11, wherein the condition of light incidence comprises an incidence azimuth angle defined between a direction of the pattern and a plane of incidence.

16. An apparatus according to claim 11, wherein the condition of light incidence comprises a wavelength of input light.

17. An apparatus according to claim 11, wherein the state of formation of the pattern relates to a duty of the pattern.

18. An apparatus according to claim 11, wherein the state of formation of the pattern relates to a sectional shape of the pattern.

19. An apparatus according to claim 11, wherein the pattern comprises a latent image pattern before a developing process.

20. An apparatus according to claim 11, wherein the pattern comprises a developed pattern after a developing process.

21. A projection exposure method for irradiating a pattern of a first object onto a second object coated with a photosensitive material through a projection optical system, said method comprising the steps of:
- illuminating, with an illuminator, the pattern of the first object with polarized light while changing an exposure condition and irradiating the pattern of the first object so illuminated onto the second object, whereby a plurality of patterns are formed on the second object;
- detecting, through an analyzer, polarized light from the pattern as illuminated by the illuminator and producing a signal;
- detecting, with a processor, a state of polarization of the light from the pattern, by use of the signal from said detecting step, to inspect the state of the pattern, and for producing an output from the processor; and
- changing a condition of the illumination by the illuminator in said illuminating step, on the basis of the output produced by the processor.

22. A method according to claim 21, wherein the state of formation of the patterns is detected through the processor on the basis of a change in light under different conditions of light incidence.

23. A method according to claim 21, wherein the condition of incidence is determined through the processor on the basis of a change in light under different conditions of light incidence, and the state of formation of the patterns is detected as the illuminator illuminates the patterns with the polarized light with the thus determined condition of light incidence.

24. A method according to claim 21, wherein the condition of light incidence comprises an incidence angle of input light.

25. A method according to claim 21, wherein the condition of light incidence comprises an incidence azimuth angle defined between a direction of the pattern and a plane of incidence.

26. A method according to claim 21, wherein the condition of light incidence comprises a wavelength of input light.

27. A method according to claim 21, wherein the exposure condition relates to the amount of exposure upon the second object.

28. A method according to claim 21, wherein the exposure condition relates to the position of the surface of the second object with respect to a direction of an optical axis of the projection optical system.

29. A method according to claim 21, wherein the state of formation of the pattern relates to a duty of the pattern.

30. A method according to claim 21, wherein the state of formation of the pattern relates to a sectional shape of the pattern.

31. A method according to claim 21, wherein the pattern comprises a latent image pattern before a developing process.

32. A method according to claim 21, wherein the pattern comprises a developed pattern after a developing process.

33. A substrate processing procedure monitoring system, comprising:
- an illuminator for illuminating a pattern defined on a substrate with polarized light;
- a detector for detecting, through an analyzer, polarized light from the pattern as illuminated by said illuminator and for producing a signal;
- a processor for detecting a state of polarization of the light from the pattern, by use of the signal from said detector, to inspect the state of the pattern, for memorizing and comparing results of detection of the state of polarization of the pattern before and after the processing procedure to the substrate and for producing an output; and
- changing means for changing a condition of the illumination by said illuminator in accordance with the output from said processor.

34. A system according to claim 33, wherein said processor discriminates a fault in the processing procedure, on the basis of the result of the comparison.

35. A system according to claim 33, wherein said processor discriminates whether the change in input light is within a predetermined range and discriminates whether the state of formation of the pattern is satisfactory or not.

36. A system according to claim 33, wherein, for discrimination of satisfactoriness of the state of formation of the pattern before and after the substrate processing procedure, there are different ranges as the predetermined range.

37. A system according to claim 33, wherein there are plural patterns formed on the substrate, and said processor memorizes and compares, for each pattern, the results of detection of the state of formation of that pattern before and after the substrate processing procedure.

38. A system according to claim 33, wherein the substrate processing procedure comprises one of a developing process, an etching process and an ashing process.

39. A substrate processing procedure monitoring method, comprising the steps of:
   illuminating, with an illuminator, a periodic pattern defined on a substrate with polarized light;
   detecting, through an analyzer, polarized light from the pattern as illuminated by the illuminator and for producing a signal;
   detecting, with a processor, a state of polarization of the light from the pattern, by use of the signal from said detecting step to inspect the state of the pattern;
   memorizing and comparing, with the processor, results of detection of the state of formation of the pattern before and after the processing procedure to the substrate and for producing an output from the processor; and
   changing means for changing a condition of the illumination by the illuminator in accordance with the output from the processor.

40. A method according to claim 39, wherein said processing step is effective to discriminate a fault in the processing procedure, on the basis of the result of the comparison.

41. A method according to claim 39, wherein said processing step is effective to discriminate whether the change in input light is within a predetermined range and to discriminate whether the state of formation of the pattern is satisfactory or not.

42. A method according to claim 39, wherein, for discrimination of satisfactoriness of the state of formation of the pattern before and after the substrate processing procedure, there are different ranges as the predetermined range.

43. A method according to claim 39, wherein there are plural patterns formed on the substrate, and said processing step is effective to memorize and compare, for each pattern, the results of detection of the state of formation of that pattern before and after the substrate processing procedure.

44. A method according to claim 39, wherein the substrate processing procedure comprises one of a developing process, an etching process and an ashing process.

45. An inspection system for inspecting a state of a pattern formed on an object, said system comprising:
   an illuminator for illuminating the pattern on the object with polarized light;
   a detector for detecting, through an analyzer, polarized light from the pattern as illuminated by said illuminator and for producing a signal;
   a processor for detecting a state of polarization of the light from the pattern, by use of the signal from said detector, to inspect the state of the pattern; and
   changing means for changing a condition of the illumination by said illuminator.

46. A projection exposure apparatus for projecting a pattern of a first object, as illuminated with exposure light, onto a second object coated with a photosensitive material, through a projection optical system to thereby form a pattern on the second object, said apparatus comprising:
   illuminator for illuminating the pattern with polarized light;
   a detector for detecting, through an analyzer, polarized light from the pattern as illuminated by said illuminator and for producing a signal;
   a processor for detecting a state of polarization of the light from the pattern, by use of the signal from said detector, to inspect the state of the pattern; and
   changing means for changing a condition of the illumination by said illuminator.

47. A projection exposure method for irradiating a pattern of a first object onto a second object coated with a photosensitive material through a projection optical system, said method comprising the steps of:
   illuminating, with an illuminator, the pattern of the first object with polarized light while changing an exposure condition and irradiating the pattern of the first object so illuminated onto the second object, whereby a plurality of patterns are formed on the second object;
   detecting, through an analyzer, polarized light from the pattern as illuminated by the illuminator and producing a signal;
   detecting, with a processor, a state of polarization of the light from the pattern, by use of the signal from said detecting step, to inspect the state of the pattern; and
   changing a condition of the illumination by the illuminator in said illuminating step.

48. A substrate processing procedure monitoring system, comprising:
   an illuminator for illuminating a pattern defined on a substrate with polarized light;
   a detector for detecting, through an analyzer, polarized light from the pattern as illuminated by said illuminator and for producing a signal;
   a processor for detecting a state of polarization of the light from the pattern, by use of the signal from said detector, to inspect the state of the pattern, for memorizing and comparing results of detection of the state of polarization of the pattern before and after the processing procedure to the substrate; and
   changing means for changing a condition of the illumination by said illuminator.

49. A substrate processing procedure monitoring method, comprising the steps of:
   illuminating, with an illuminator, a periodic pattern defined on a substrate with polarized light;
   detecting, through an analyzer, polarized light from the pattern as illuminated by the illuminator and for producing a signal;
   detecting, with a processor, a state of polarization of the light from the pattern, by use of the signal from said detecting step to inspect the state of the pattern;
   memorizing and comparing, with the processor, results of detection of the state of formation of the pattern before and after the processing procedure to the substrate; and
   changing means for changing a condition of the illumination by the illuminator.

* * * * *

UNITED STATES PATENT AND TRADEMARK OFFICE
CERTIFICATE OF CORRECTION

PATENT NO. : 6,594,012 B2
DATED : July 15, 2003
INVENTOR(S) : Seiji Takeuchi et al.

It is certified that error appears in the above-identified patent and that said Letters Patent is hereby corrected as shown below:

Title page,
Item [*] Notice, insert -- This patent issued on a continued prosecution application filed under 37 CFR 1.53(d), and is subject to the twenty year patent term provisions of 35 U.S.C. 154(a)(2). --
Item [57], ABSTRACT,
Line 3, "on to" should read -- onto --; and
Line 7, "to detect" should read -- for detecting --.

Figure 15:
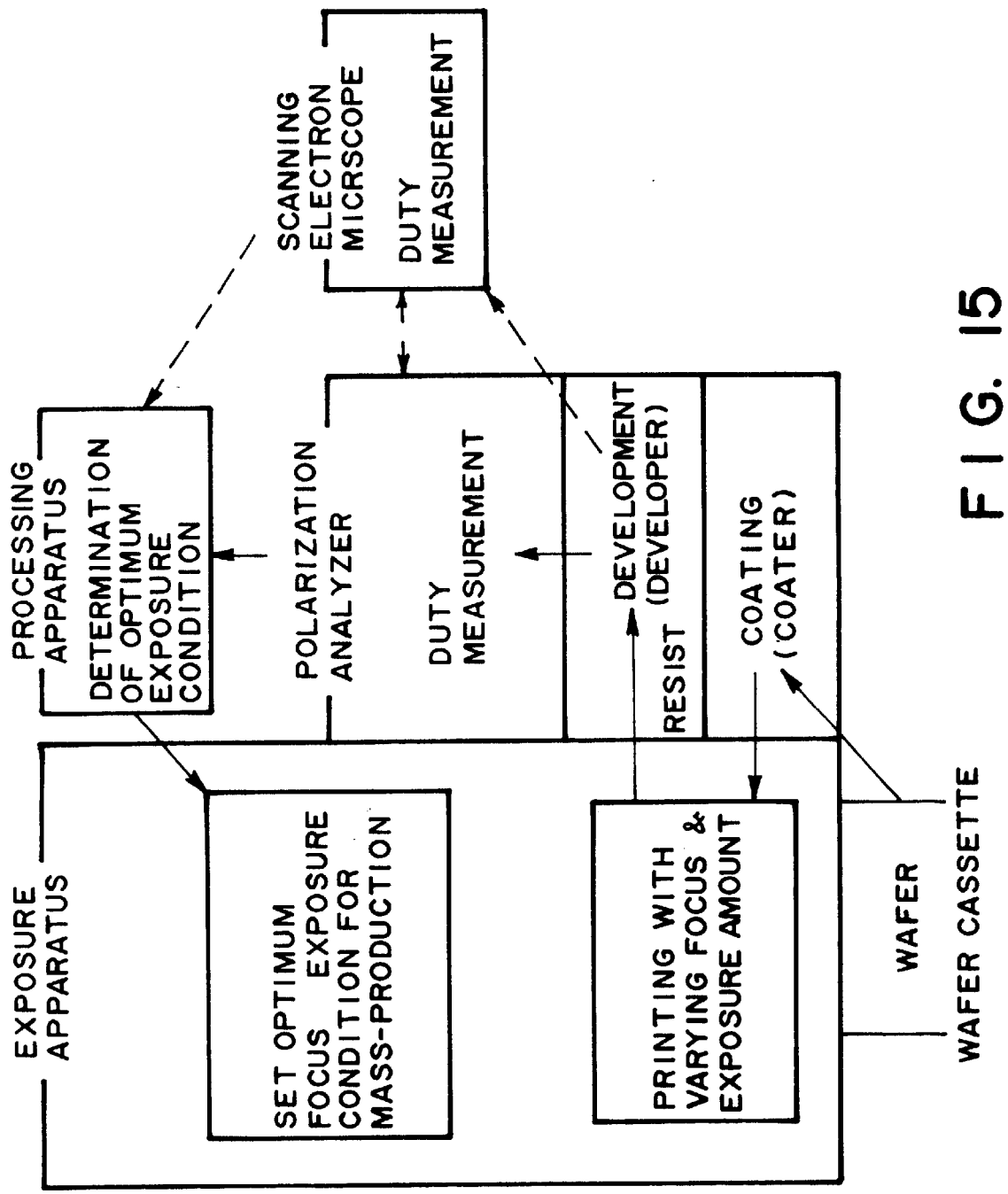
FIG. 15 is a schematic view of an arrangement according to an embodiment of the present invention, wherein a development process is added.

Drawings,
SHEET 2, FIG. 2, "DETECTER" should read -- DETECTOR --.
SHEET 5, FIG. 5, "EXPOSRE" should read -- EXPOSURE --.
SHEET 15, FIG. 15, "MICRSCOPE" should read -- MICROSCOPE --.
SHEET 18, FIG. 18, "DETECTER" should read -- DETECTOR --.

Column 1,
Line 13, "of" should read -- of an --;
Lines 14 and 31, "in" (second occurrence) should read -- in a --;
Line 15, "for" should read -- for the --;
Line 17, "CCD," should read -- CCD's, --;
Lines 19, 23 (second occurrence), 25, 41 and 48, "of" should read -- of a --;
Line 24, "as" should read -- as an --; and "been" should be deleted;
Line 27, "to" should read -- of --;
Line 43, "set" should read -- set an --; and "as" should read -- as a --;
Line 47, "steppers," should read -- steppers, a --;
Line 49, "such" should read -- such a --;
Line 52, "After" should read -- After the --;
Line 56, "Optimum" should read -- An optimum --;
Line 57, "regards" should read -- regards the --; and "of" should read -- of a --;
Line 58, "with" should read -- with a --;
Line 59, "changing" should read -- changing an --;
Line 60, "by" should read -- by a --; and "regards" should read -- regards a --;
Line 63, "with" should read -- with a --; and
Line 64, "changing" should read -- changing a -- and "by" should read -- by a --.

Column 2,
Line 1, "this," should read -- this, an --;
Line 2, "and" should read -- and an --;
Line 6, "setting" should read -- setting an --;
Lines 12, 14 and 16, "such" should read -- such a --;
Line 18, "change which in turn" should read -- change, which in turn, --; and "is" should read -- is, --;

UNITED STATES PATENT AND TRADEMARK OFFICE
CERTIFICATE OF CORRECTION

PATENT NO. : 6,594,012 B2
DATED : July 15, 2003
INVENTOR(S) : Seiji Takeuchi et al.

It is certified that error appears in the above-identified patent and that said Letters Patent is hereby corrected as shown below:

Column 2 (cont'd),
Line 19, "therefore" should read -- therefore, --;
Line 29, "which" should read -- which an --;
Line 35, "(i.e." should read -- (i.e., --;
Line 40, "of" should read -- of a --;
Line 50, "(i.e." should read -- (i.e., --; and "before" should read -- before a --; and
Line 65, "on to" should read -- onto --.

Column 3,
Lines 7, 11, 24, 38 and 50, "on to" should read -- onto --;
Line 19, "for projecting" (second occurrence) should be deleted; and "on to" should read -- onto --; and
Line 32, "controlling" should read -- controlling an --.

Column 4,
Line 6, "of" should read -- of an --;
Line 8, "with" should read -- with a --;
Line 12, "of" should read -- shown in --;
Lines 16 and 29, "of" should read -- of a --;
Line 18, "where" should read -- in which a --; and
Line 21, "explaining" should read -- explaining a --.

Column 5,
Line 11, "such" should read -- such a --;
Line 14, "Latent" should read -- a latent --;
Line 24, "in" (first occurrence) should read -- in the --;
Line 38, "on to" should read -- onto --;
Line 50, "on a case where" should read -- of a case in which --; and
Line 57, "that" should read -- that a --.

Column 6,
Lines 9, 41 (first occurrence) and 54, "of" should read -- of a --;
Line 12, "an" should be deleted;
Lines 35, 49 and 61, "such" should read -- such a --;
Line 36, "art," should read -- art, a --;
Line 40, "wavelength)," should read -- wavelength), an --;
Line 50, "with" should read -- with an --;
Line 57, "after" should read -- after being --;
Line 63, "with" should read -- with a --; and
Line 64, "on" should read -- on the --.

UNITED STATES PATENT AND TRADEMARK OFFICE
CERTIFICATE OF CORRECTION

PATENT NO. : 6,594,012 B2
DATED : July 15, 2003
INVENTOR(S) : Seiji Takeuchi et al.

It is certified that error appears in the above-identified patent and that said Letters Patent is hereby corrected as shown below:

Column 7,
Line 7, "on to" should read -- onto --;
Line 22, "to" should read -- to the --;
Line 48, "FIG. 4," should read -- FIG. 4, a --; and "on" should read -- of --; and
Line 67, "to" should read -- to the --.

Column 8,
Line 14, "control" should read -- control an --;
Lines 21 and 25, "on to" should read -- onto --;
Line 23, "Next," should read -- Next, a --; and "on" should read -- of --;
Line 34, "with" should read -- with a --; and
Line 60, "corresponds" should read -- correspond --.

Column 9,
Line 21, "these" should read -- the --;
Line 35, "of" should read -- of the --;
Line 41, "of" should read -- of a --;
Line 43, "sine wave of" should read -- a sine wave of the --;
Line 58, "with" should read -- with a --; and
Line 60, "improved." should read -- improved: --.

Column 10,
Line 6, "exposed" (second occurrence) should read -- unexposed --;
Line 22, "when" should read -- when a --;
Line 34, "in" should read -- in a --;
Line 40, "represents" should read -- represent --;
Lines 41 and 67, "of" should read -- of a --;
Line 48, "through" should read -- through a --;
Line 54, "and" should read -- and an --; and "of" (second occurrence) should read -- of the --;
Line 60, "with" should read -- with a --;
Line 62, "is" should read -- are --; and
Line 66, "on" should read -- on the --.

Column 11,
Line 12, "after" should read -- after a --;
Line 29, "Before" should read -- Before a --;
Line 32, "of" (both occurrences) should read -- of the --;
Line 47, "of" should read -- of a --;
Line 53, "of" (second occurrence) should read -- of the --;
Line 57, "specifically," should read -- specifically, a --;

UNITED STATES PATENT AND TRADEMARK OFFICE
CERTIFICATE OF CORRECTION

PATENT NO.   : 6,594,012 B2
DATED        : July 15, 2003
INVENTOR(S)  : Seiji Takeuchi et al.

It is certified that error appears in the above-identified patent and that said Letters Patent is hereby corrected as shown below:

Column 11 (cont'd),
Line 61, "as" should read -- as that of --; and
Line 65, "system" should read -- system is used --.

Column 12,
Line 8, "with" should read -- with the --;
Lines 10 and 44 (first occurrence), "in" should read -- in the --;
Line 11, "embodiment" should read -- embodiment, --; and "with" should read -- with the --;
Line 18, "since" should read -- since an --;
Line 30, "as" should read -- as that of --;
Line 31, "Similar" should read -- A similar --;
Line 39, "with" should read -- with a --;
Line 45, "where" should read -- in which --;
Line 48, "as" should read -- as that --;
Line 53, "example" should read -- example, --;
Line 58, "with" should read -- with the --; and
Line 64, "embodiment" should read -- embodient, --.

Column 13,
Line 5, "chose" should read -- choose --; and "angels" should read -- angles --;
Lines 10 and 30, "of" should read -- of the --;
Line 43, "parameters" should read -- parameters, --;
Line 47, "as" should read -- as that --;
Line 64, "in" should read -- in the --; and
Line 66, "along" should read -- along the --.

Column 14,
Lines 3, 31 and 39, "of" should read -- of a --;
Line 6, "direction," should read -- direction, a --;
Line 12, "similarly" should read -- similar --;
Line 23, "to" should read -- of --;
Line 29, "Similar" should read -- A similar --;
Line 34, "as" should read -- as that --;
Line 49, "of" should read -- of the --;
Line 50, "angle," should read -- angle, and --; and
Line 58, "as" should read -- as an --; and "of" should read -- of the --.

UNITED STATES PATENT AND TRADEMARK OFFICE
CERTIFICATE OF CORRECTION

PATENT NO. : 6,594,012 B2
DATED : July 15, 2003
INVENTOR(S) : Seiji Takeuchi et al.

It is certified that error appears in the above-identified patent and that said Letters Patent is hereby corrected as shown below:

Column 15,
Line 1, "on" should read -- on a --;
Line 4, "is" should read -- are --;
Line 23, "with" should read -- with the --;
Line 36, "parameters" should read -- parameters, --;
Line 38, "with" should read -- with the --;
Line 39, "Similar" should read -- A similar --;
Line 46, "source" should read -- sources --; and "with" should read -- with a --;
Line 48, "as" should read -- as that --;
Line 56, "Light" should read -- The light --;
Line 61, "exposure or" should read -- an exposure or a --; and
Line 65, "valued" should read -- values --.

Column 16,
Line 6, "and" should read -- and an --;
Lines 15 and 60, "of" should read -- of a --;
Line 18, "procedure for" should read -- a procedure for the --;
Line 19, "(e.g." should read -- (e.g., --;
Line 31, "includes" should read -- includes an --;
Line 32, "and" (second occurrence) should read -- and a --; and
Line 33, "operation check," should read -- an operation check, a --.

Column 17,
Line 2, "patter" should read -- pattern --;
Line 4, "such" should read -- such a --;
Line 6, "Latent" should read -- A latent --;
Line 25, "on to" should read -- onto --;
Line 38, "invention," should read -- invention, a --;
Line 39, "on a case where" should read -- of a case in which --;
Line 45, "that" should read -- that a --;
Line 64, "of" should read -- of a --; and
Line 67, "an" should be deleted.

Column 18,
Line 24, "such" should read -- such a --;
Line 29, "wavelength)," should read -- wavelength), an --;
Line 30, "of" (first occurrence) should read -- of a --;
Line 38, "such" should read -- such an --; and

UNITED STATES PATENT AND TRADEMARK OFFICE
CERTIFICATE OF CORRECTION

PATENT NO.   : 6,594,012 B2
DATED        : July 15, 2003
INVENTOR(S)  : Seiji Takeuchi et al.

It is certified that error appears in the above-identified patent and that said Letters Patent is hereby corrected as shown below:

Column 18 (cont'd),
Line 67, "with" should read -- with a --.

Column 19,
Line 7, "generally" should read -- generally, --;
Line 15, "If on the other hand" should read -- If, on the other hand, --;
Line 27, "thus" should read -- thus, --;
Line 37, "and" should read -- and a --;
Line 52, "these" should read -- the --; and
Line 67, "of" should read -- of the --.

Column 20,
Lines 7 and 12, "of" should read -- of a --;
Line 9, "sine wave of" should read -- the sine wave of a --;
Line 43, "Also in this case, similarly" should read -- Also in this case, similar --; and
Line 64, "of" should read -- of the --.

Column 21,
Lines 4, 37 (first occurrence) and 53, "of" should read -- of a --;
Line 6, "at 602" should read -- at step 602, --;
Line 15, "which" should read -- which a --;
Lines 18 and 43, "in" should read -- in a --;
Line 20, "Also in cases where" should read -- Also, in cases wherein --;
Line 21, "604 the wfer" should read -- 604, the wafer --;
Line 26, "development," should read -- development, a --;
Line 27, "and" should read -- and a --;
Line 34, "an" should be deleted;
Line 49, "of" should read -- of the --;
Line 51, "pattern after" should read -- the pattern after the --;
Line 57, "step 610," should read -- step 610, a --;
Line 58, "shost" should read -- shots --; and "is" (second occurrence) should read -- are --; and
Line 59, "E, failuer of" should read -- E shots, failure of a --.

Column 22,
Line 12, "the" (second occurrence) should be deleted;
Line 15, "before" should read -- before a --;
Line 16, "in" should read -- in a --;
Line 21, "correlation with" should read -- a correlation with a --;
Line 25, "taking" should read -- taking a --;
Line 29, "after" should read -- after a --;
Line 33, "by" should read -- by a --;

UNITED STATES PATENT AND TRADEMARK OFFICE
CERTIFICATE OF CORRECTION

PATENT NO.     : 6,594,012 B2
DATED          : July 15, 2003
INVENTOR(S)    : Seiji Takeuchi et al.

It is certified that error appears in the above-identified patent and that said Letters Patent is hereby corrected as shown below:

Column 22 (cont'd),
Lines 36 and 47, "of" should read -- of the --;
Line 37, "for" should read -- for a --;
Line 38, "In" should read -- On --;
Line 40, "with" should read -- with the --;
Line 56, "as" (first occurrence) should read -- as that --;
Line 61, "silicone" should read -- silicon --;
Line 63, "of" should read -- of a --; and
Line 64, "complexed. Since in the etching process" should read -- complex. Since, in the etching process, --.

Column 23,
Lines 4, 43 (first occurrence) and 60, "of" should read -- of a --;
Line 19, "described," should read -- described, a --;
Line 23, "step 804" should read -- step 804, --;
Line 32, "step 806," should read -- step 806, a --;
Line 34, "process," should read -- process, a --;
Line 35, "and" should read -- and a --;
Line 49, "in" should read -- in a --;
Line 50, "that" should read -- that the --;
Line 56, "of" should read -- of the --;
Line 58, "of" should read -- of the --; and "process." should read -- process has been determined. --;
Line 64, "step 810," should read -- step 810, a --; and
Line 65, "shost" should read -- shots --; and "is any E, failuer of" should read -- are any E shots, failure of a --.

Column 24,
Line 2, "is no E," should read -- are no E shots, --;
Line 7, "process" should read -- process, it --;
Line 9, "alram" should read -- alarm --;
Line 11, "of" should read -- of the --;
Line 16, "where" should read -- wherein --;
Line 21, "as" should read -- as that --;
Line 46, "process," should read -- process, a --;
Line 47, "and" should read -- and a --;
Line 50, "reist" should read -- resist --;
Line 54, "have" should read -- have been --;
Line 55, "of" should read -- of a --; and
Line 66, "in" should read -- in a --.

UNITED STATES PATENT AND TRADEMARK OFFICE
CERTIFICATE OF CORRECTION

PATENT NO. : 6,594,012 B2
DATED : July 15, 2003
INVENTOR(S) : Seiji Takeuchi et al.

It is certified that error appears in the above-identified patent and that said Letters Patent is hereby corrected as shown below:

Column 25,
Line 3, "of" should read -- of the --; and "process." should read -- process has been determined. --;
Line 5, "of" should read -- of a --;
Line 6, "ecting" should read -- etching --;
Line 9, "910," should read -- 910, a --;
Line 10, "shost" should read -- shots --; and "is any E, failuer of" should read -- are any E shots, failure of a --;
Line 14, "is no E," should read -- are no E shots, --;
Line 21, "alram" should read -- alarm --;
Line 23, "of" should read -- of the --;
Line 29, "measurement" should read -- a measurement --; and "and" should read -- and a --;
Line 30, "for" should read -- for a --;
Line 40, "as" should read -- as in --;
Line 48, "formation;" should read -- formation, --;
Line 50, "state" should read -- the state --;
Line 52, "from" should read -- from a --;
Line 57, "any" should read -- some --; and "involed" should read -- involved --;
Line 61, "measuremen" should read -- measurement --;
Line 65, "from" should read -- from a --;
Line 66, "wafer," should read -- wafer, a --; and
Line 67, "plual" should read -- plural --.

Column 26,
Line 10, "occured in" should read -- occurred in --;
Line 13, "occured" should read -- occurring --;
Line 15, "alram" should read -- alarm --; and
Line 17, "of" should read -- of the --.

UNITED STATES PATENT AND TRADEMARK OFFICE
CERTIFICATE OF CORRECTION

PATENT NO.    : 6,594,012 B2
DATED         : July 15, 2003
INVENTOR(S)   : Seiji Takeuchi et al.

It is certified that error appears in the above-identified patent and that said Letters Patent is hereby corrected as shown below:

Column 29,
Line 1, "claim 33," should read -- claim 35, --; and
Line 40, "claim 39," should read -- claim 41, --.

Signed and Sealed this

Twenty-sixth Day of July, 2005

JON W. DUDAS
*Director of the United States Patent and Trademark Office*